US012575203B2

(12) United States Patent
Varghese et al.

(10) Patent No.: US 12,575,203 B2
(45) Date of Patent: Mar. 10, 2026

(54) OPTICAL COMPONENT AND IMAGE SENSOR COMPRISING AN OPTICAL COMPONENT

(71) Applicant: InterDigital CE Patent Holdings, SAS, Paris (FR)

(72) Inventors: Bobin Varghese, Munich (DE); Oksana Shramkova, Liffré (FR); Laurent Blonde, Thorigné-Fouillard (FR); Valter Drazic, Betton (FR)

(73) Assignee: InterDigital CE Patent Holdings, SAS, Paris (FR)

( * ) Notice: Subject to any disclaimer, the term of this patent is extended or adjusted under 35 U.S.C. 154(b) by 504 days.

(21) Appl. No.: 18/017,257

(22) PCT Filed: Jul. 22, 2021

(86) PCT No.: PCT/EP2021/070613
§ 371 (c)(1),
(2) Date: Jan. 20, 2023

(87) PCT Pub. No.: WO2022/023185
PCT Pub. Date: Feb. 3, 2022

(65) Prior Publication Data
US 2023/0290796 A1 Sep. 14, 2023

(30) Foreign Application Priority Data

Jul. 30, 2020 (EP) .................................... 20305871

(51) Int. Cl.
*H10F 39/00* (2025.01)
*H10F 39/18* (2025.01)

(52) U.S. Cl.
CPC ......... *H10F 39/8053* (2025.01); *H10F 39/18* (2025.01); *H10F 39/811* (2025.01)

(58) Field of Classification Search
CPC ....... H10F 39/81; H10F 39/806; G02B 5/008; G02B 5/288; G01J 2001/448;
(Continued)

(56) References Cited

U.S. PATENT DOCUMENTS 9,362,324 B1 6/2016 Astratov
2007/0023799 A1* 2/2007 Boettiger .............. H10F 39/024
257/292
(Continued)

FOREIGN PATENT DOCUMENTS

EP 3333600 A1 6/2018
EP 3591700 1/2020
(Continued)

OTHER PUBLICATIONS

Hasan, M., et al. "Photonic nanojet-enhanced nanometer-scale germanium photodiode". Applied Optics, Optical Society of America, vol. 52(22), Aug. 1, 2013, pp. 5420-5425 (6 pages).
(Continued)

*Primary Examiner* — William B Partridge
*Assistant Examiner* — David Paul Sedorook
(74) *Attorney, Agent, or Firm* — Klintworth & Rozenblat LLP

(57) ABSTRACT

In example embodiments, an optical component includes a dielectric structure having a substantially rectangular cross-section with an upper surface and a lower surface. A first electrically conducting layer is provided on the upper surface, where the first electrically conducting layer has a first opening positioned to accept incoming electromagnetic radiation. The second electrically conducting layer has a second opening positioned to emit electromagnetic radiation, e.g. toward a CMOS sensor pixel in a silicon substrate.
(Continued)

The dimensions of the optical component are configured to provide constructive interference for incident radiation of a selected wavelength.

14 Claims, 22 Drawing Sheets

(58) Field of Classification Search
CPC ............. G01J 1/0437; H01L 27/14625; H01L 27/14621; H01L 27/14636; H01L 27/14643
See application file for complete search history.

(56) References Cited

U.S. PATENT DOCUMENTS

| | | | |
|---|---|---|---|
| 2009/0017575 A1* | 1/2009 | Knudsen ............... | H10F 39/024 257/E31.128 |
| 2010/0163714 A1* | 7/2010 | Wober .................. | H10F 39/806 250/227.2 |
| 2012/0257204 A1 | 10/2012 | Walters | |
| 2014/0339664 A1* | 11/2014 | Rossi .................... | H10F 39/018 257/432 |
| 2019/0025510 A1 | 1/2019 | Goddard | |
| 2019/0250315 A1 | 8/2019 | Boriskin | |
| 2020/0012682 A1 | 1/2020 | Plans | |
| 2020/0152682 A1* | 5/2020 | Boriskin ............... | H04N 23/55 |
| 2020/0233223 A1 | 7/2020 | Shramkova | |

FOREIGN PATENT DOCUMENTS

| | | |
|---|---|---|
| EP | 3632564 A1 | 4/2020 |
| EP | 3633437 A1 | 4/2020 |
| WO | 2019063241 | 4/2019 |
| WO | 2019175010 | 9/2019 |
| WO | 2020007534 A1 | 1/2020 |
| WO | 2020065079 | 4/2020 |
| WO | 2020070129 A1 | 4/2020 |
| WO | 2020070135 | 4/2020 |

OTHER PUBLICATIONS

International Search Report and Written Opinion for PCT/EP2021/070613 mailed Nov. 10, 2021 (12 pages).

International Preliminary Report on Patentability for PCT/EP2021/070613 issued Jan. 31, 2023 (8 pages).

Yokogawa, S. et al., "IR sensitivity enhancement of CMOS Image Sensor with diffractive light trapping pixels." Scientific Reports 7, No. 1, 3832, 2017 (9 pages).

Choi, J. et al., "Spatially localized wavelength-selective absorption in morphology-modulated semiconductor nanowires." Optics Express vol. 25, No. 19, Sep. 2017: 22750-22759 (10 pages).

Mokkapati, S. et al., "Optical design of nanowire absorbers for wavelength selective photodetectors." Scientific reports 5, No. 1, 2015: 15339 (7 pages).

Boriskin, Artem, et. al., "Near Field Focusing By Edge Diffraction". Optics Letters, vol. 43, No. 16, Aug. 2018, pp. 4053-4056 (4 pages).

Varghese, B. et al., "Influence of an edge height on the diffracted EM field distribution." In 2019 21st International Conference on Transparent Optical Networks (ICTON), pp. 1-4. IEEE, 2019 (4 pages).

Salhi, M. et al., "Photonic nanojet as a result of a focused near-field diffraction." Journal of the Optical Society of America B vol. 36 No. 4, Apr. 2019 pp. 1031-1036 (6 pages).

* cited by examiner

Air d $\theta_{inc}$ $\lambda_{inc}$ $n_L$ 206          210

W $n_H$ 208          212

202          $h_{element}$ $d_{element}$

Silicon

204

Y

Z          X

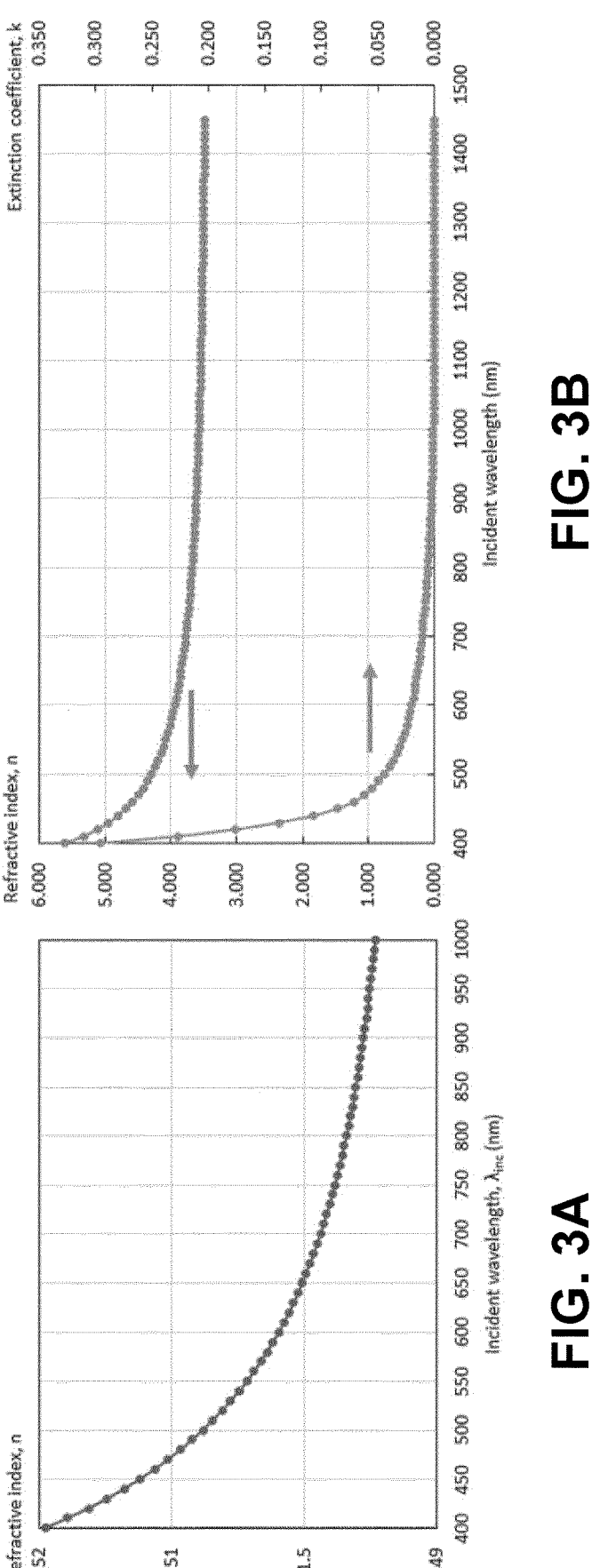
FIG. 3B
FIG. 3A

Air d $\theta_{inc}$ $\lambda_{inc}$ 2306     2310

2314     W     2316

2308     2302     2312   α

$h_{element}$ $d_{element}$

Silicon

2304

Y

Z   X

OPTICAL COMPONENT AND IMAGE SENSOR COMPRISING AN OPTICAL COMPONENT

CROSS-REFERENCE TO RELATED APPLICATIONS

The present application is a national stage application under 35 U.S.C. § 371 of International Application No. PCT/EP2021/070613, entitled "OPTICAL COMPONENT AND IMAGE SENSOR COMPRISING AN OPTICAL COMPONENT," filed Jul. 22, 2021, which claims priority from European Provisional Patent Application No. EP20305871.4, entitled "OPTICAL COMPONENT AND IMAGE SENSOR COMPRISING AN OPTICAL COMPONENT," filed 30 Jul. 2020, which are hereby incorporated by reference in their entirety.

BACKGROUND

This section is intended to introduce the reader to various aspects of art, which may be related to various aspects of the present disclosure that are described and/or claimed below. This discussion is believed to be helpful in providing the reader with background information to facilitate a better understanding of the various aspects of the systems and methods described herein. Accordingly, it should be understood that these statements are to be read in this light, and not as admissions of prior art.

The present disclosure is related to the domain of CMOS sensors. Some CMOS sensors operate on the photoelectric effect, which converts incident photons into electrical charges generating an electrical voltage (using integrated electronics) that is a function of the illumination intensity. Some CMOS sensors are used for near-infrared (NIR) wavelengths. Such NIR CMOS sensors have gradually gained market share and are replacing classical CCD sensors, which can be expensive and less efficient. CMOS NIR sensors have uses in digital cameras for capturing data in poor lighting conditions (traffic management at night, for example). Such sensors also have uses in security, personal authentication and range-finding applications.

In practice, an image sensor may use a microlens to focus the incident radiation onto the photosensitive part of the device, usually a semiconductor substrate such as silicon. Silicon possess a small absorption coefficient which calls for a thick photon absorption layer, which in turn increases the chip cost as fabrication of thick substrate CMOS sensors uses expensive manufacturing equipment.

A conventional CMOS sensor consists of a microlens and a photosensitive part to convert the received photons to electrons. However, such an optical stack has no filtering capacity to let only a limited waveband centered on one wavelength to pass through it and reach the photodetector. Thus, some sensors also use a color filter layer.

Wavelength selective absorption has been proposed in literature by using techniques such as diffractive light trapping pixels, silicon nanowires with a hexagonal cross-section, and III-V semiconductor nanowires. Such systems generally call for complex and expensive manufacturing techniques.

SUMMARY

References in the specification to "one embodiment," "an embodiment," "an example embodiment," and the like indicate that the embodiment described may include a particular feature, structure, or characteristic; but not every embodiment necessarily includes that particular feature, structure, or characteristic. Moreover, such phrases are not necessarily referring to the same embodiment. Further, when a particular feature, structure, or characteristic is described in connection with an embodiment, such feature, structure, or characteristic may be used in connection with other embodiments whether or not explicitly described.

An optical component according to some embodiments comprises: a dielectric structure having at least one side surface open to accepting incoming electromagnetic radiation, an upper surface, and a lower surface; a first electrically conducting layer on the upper surface, the first electrically conducting layer having a first opening positioned to accept incoming electromagnetic radiation; and a second electrically conducting layer on the lower surface, the second electrically conducting layer having a second opening positioned to emit electromagnetic radiation.

In some embodiments, the dielectric structure is substantially rectangular in cross-section.

In some embodiments, the first opening and the second opening have substantially the same width.

In some embodiments, the first opening and the second opening are substantially centered on the dielectric structure.

In some embodiments, the dielectric structure is mounted on a silicon substrate, the second opening being positioned to emit electromagnetic radiation into the silicon substrate.

Some embodiments further comprise a photodetector underlying the dielectric structure.

In some embodiments, the dielectric structure has a height $h_{element}$ between 1600 nm and 1900 nm and a width $d_{element}$ between 1100 nm and 1400 nm.

In some embodiments, the dielectric structure has a height $h_{element}$ between 900 nm and 1300 nm and a width $d_{element}$ between 750 nm and 1050 nm.

In some embodiments, the first opening and the second opening each have a width between 150 nm and 200 nm.

In some embodiments, the optical component is configured to selectively transmit incoming electromagnetic radiation with wavelength $\lambda_{inc}$, wherein a height $h_{element}$ of the dielectric structure is substantially equal to $\lambda_{inc}/(n_H-n_L)$, where $n_H$ is a refractive index of the dielectric structure and $n_L$ is a refractive index of an ambient medium.

In some embodiments, the optical component is configured to selectively transmit incoming electromagnetic radiation with wavelength $\lambda_{inc}$, wherein a width $d_{element}$ of the dielectric structure is no less than $$\frac{2\lambda_{inc}\tan(\theta_B)}{n_H - n_L},$$

where $$\theta_B = \frac{90° - \sin^{-1}(n_L/n_H)}{2},$$

and where $n_H$ is a refractive index of the dielectric structure and $n_L$ is a refractive index of an ambient medium.

In some embodiments, the dielectric structure is configured such that, for a selected wavelength $\lambda_{inc}$ of electromagnetic radiation, waves entering the dielectric structure through the first opening and through the side surface interfere constructively at the second opening.

An image sensor according to some embodiments comprises a two-dimensional array of the optical components as described herein.

A method according to some embodiments includes directing electromagnetic radiation on an optical component, wherein the optical component comprises: a dielectric structure having at least one side surface open to accepting incoming electromagnetic radiation, an upper surface, and a lower surface; a first electrically conducting layer on the upper surface, the first electrically conducting layer having a first opening positioned to accept incoming electromagnetic radiation; and a second electrically conducting layer on the lower surface, the second electrically conducting layer having a second opening positioned to emit electromagnetic radiation.

In some embodiments of the method, a height $h_{element}$ of the dielectric structure is substantially equal to $\lambda_{inc}/(n_H-n_L)$, where $n_H$ is a refractive index of the dielectric structure and $n_L$ is a refractive index of an ambient medium.

In some embodiments of the method, a width $d_{element}$ of the dielectric structure is no less than $$\frac{2\lambda_{inc}\tan(\theta_B)}{n_H - n_L},$$

where $$\theta_B = \frac{90° - \sin^{-1}(n_L/n_H)}{2},$$

and where $n_H$ is a refractive index of the dielectric structure and $n_L$ is a refractive index of an ambient medium.

Some embodiments further include operating a photodetector to detect an amount of electromagnetic radiation emitted through the second opening.

In some embodiments, an optical component includes: a dielectric structure having a substantially rectangular cross-section with an upper surface and a lower surface; a first electrically conducting layer on the upper surface, the first electrically conducting layer having a first opening positioned to accept incoming electromagnetic radiation; and a second electrically conducting layer on the lower surface, the second electrically conducting layer having a second opening positioned to emit electromagnetic radiation.

In some embodiments, the first opening and the second opening each have a width (w) that is smaller than a width ($d_{element}$) of the dielectric structure.

In some embodiments, the first opening and the second opening have substantially the same width.

In some embodiments, the first opening and the second opening are substantially centered on the dielectric structure.

In some embodiments, the optical component is mounted on a silicon substrate or other substrate of a photosensitive material.

Some embodiments further include a photodetector underlying the dielectric structure. The photodetector may be a pixel of a CMOS image sensor.

In some embodiments, the dielectric structure has at least one side surface configured to accept incoming electromagnetic radiation.

In some embodiments, the dielectric structure comprises a photopolymer.

In some embodiments, the electrically conducting layers are metal layers.

BRIEF DESCRIPTION OF THE DRAWINGS

FIGS. 3A-3B show example dispersion characteristics of refractive index and extinction coefficient of the photoresist (FIG. 3A) and silicon (FIG. 3B) considered during simulations.

DETAILED DESCRIPTION

Some embodiments operate to improve the optical absorption of incident light in a classical silicon substrate for a given incident wavelength Ain. In some embodiments, that incident wavelength $\lambda_{inc}$=940 nm. Image sensors configured for $\lambda_{inc}$=940 nm have applications in, for example, machine vision cameras for rapid inspection on the manufacturing/ production floor. They can also be used for automotive lidars or biometric applications to support iris recognition and finger-vein biometrics. Embodiments described herein, however, are not limited to any particular sensor application. Some of the examples herein are described for use with near infrared (NIR) radiation. Such radiation and other electromagnetic radiation is referred to herein as "light" regardless of whether it is visible to a human.

Some embodiments provide a device design that can selectively enhance the concentration of incident optical radiation for a selected wavelength in the photosensitive part of the device, thereby increasing its optical absorption and consequently its sensitivity. The rest of the incident wavelengths are reflected back into the incident direction medium.

Some embodiments provide relatively high photodetection for a waveband centered on a selected incident wavelength, e.g. $\lambda_{inc}$=940 nm, and relatively low photodetection for other wavelengths. Some embodiments are implemented without use of a focusing microlens on top of the photodetector. Some embodiments may be used in applications that might otherwise make use of a complex, multi-layered spectral IR filter. Some embodiments may be implemented without micro-structuration of the semiconductor material.

Some embodiments use a topological design of a periodic unit cell that serves to produce a focused optical hotspot for a waveband centered on a selected wavelength, such as $\lambda_{inc}$=939.8 nm, for a range of incident angles (e.g. $\theta_{inc}$=±5°) that is emitted into the silicon photodetector below. The unit cell may operate to reflect other incident light. In some embodiments, the full width half maximum (FWHM) of the waveband is around 114.5 nm, and the central wavelength has an optical power of at least 1.92 times compared to the rest of the incident wavelengths. Such embodiments may increase the number of photon-generated charge carriers for this waveband in the photodetector which, in turn, provides an increased sensitivity of the whole system for the corresponding waveband, as show in FIG. 1.

Figure 1:
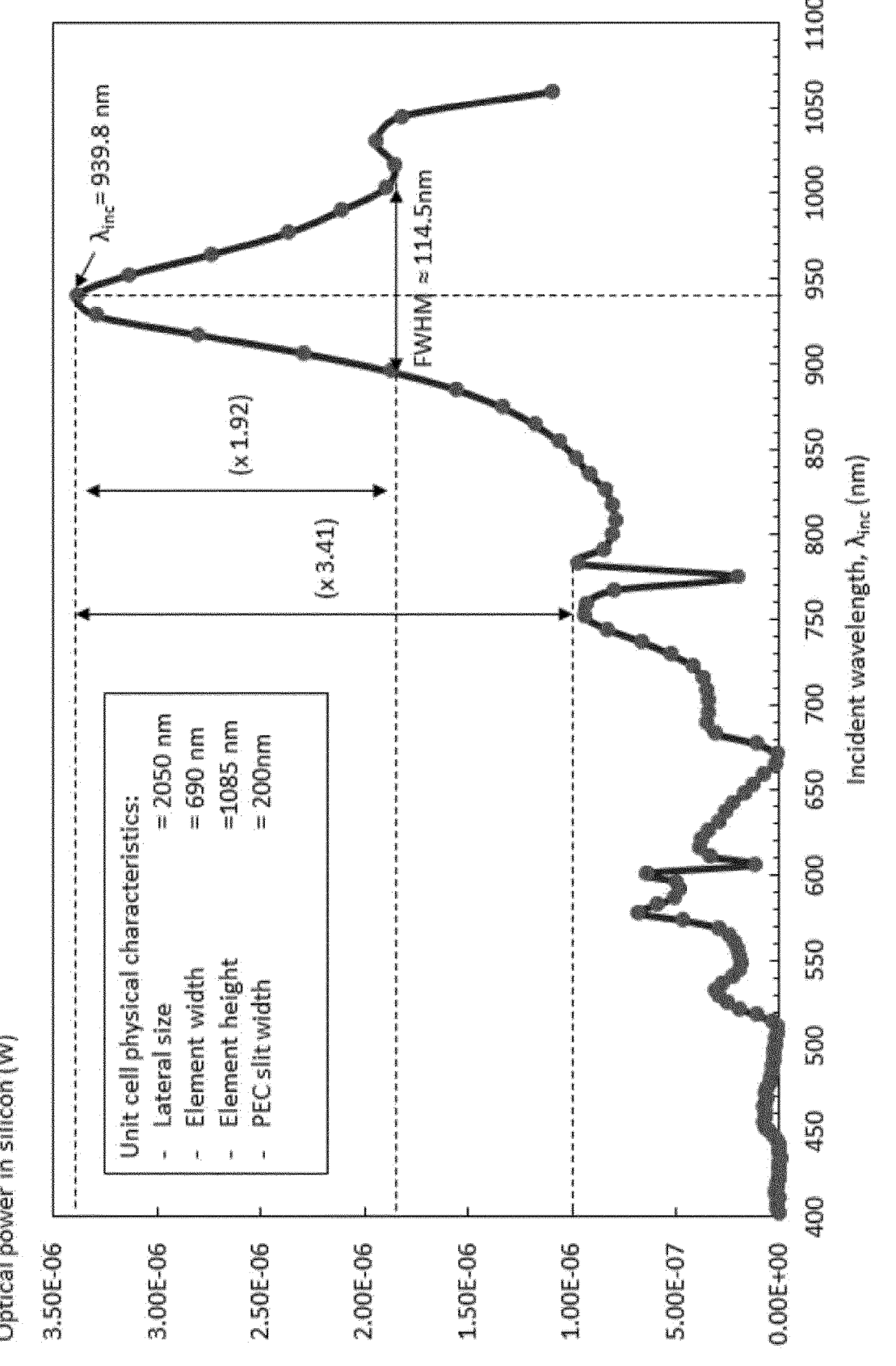
FIG. 1 illustrates spectral dependence of optical power in a silicon substrate demonstrating wavelength selective ($\lambda_{inc}$=939.8 nm) light absorption capability of an example embodiment.

FIG. 1 illustrates spectral dependence of optical power emitted into a silicon substrate demonstrating wavelength selective ($\lambda_{inc}$=939.8 nm) light absorption capability of an example embodiment.

In some embodiments, spectral dependence is achieved by employing edge diffracted waves created from different edges of the unit cell element and combining them with a spherical wave such that their constructive interference produces in the near-field a strong optical hotspot for a fixed wavelength at the desired spatial location.

Figure 2:
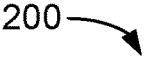
FIG. 2 is a cross-sectional schematic diagram of an optical component unit cell according to some embodiments.

FIG. 2 is a cross-sectional schematic of a unit cell aimed to selectively enhance optical power emitted into a silicon substrate for a selected incident wavelength. FIG. 2 is a cross-sectional schematic diagram of a unit cell 200 according to some embodiments. Unit cell 200 includes a dielectric element 202 that is rectangular in cross section. Dielectric element 202 has a refractive index $n_H$. and is immersed in an ambient medium (e.g. air) with refractive index $n_L$. Element 202 may be made of a commercially available polymer photoresist, such as Microchem495 PMMA. Element 202 may be provided on a silicon substrate 204. The silicon substrate 204 may include a CMOS sensor or other photodetector.

Electrically conductive layers 206 and 208, which may be metal layers, are provided above and below the rectangular element 202. The electrically conductive layers 206 and 208 include respective openings 210, 212. As discussed in further detail below, the width of the openings may be selected to provide filtration of incident light to allow primarily the desired wavelength (e.g. $\lambda_{inc}$=940 nm) to reach the silicon photodetector.

In simulations discussed herein, the electrically conductive layers are treated as perfect electrical conductors (PEC). The conductive layers may thus be referred to here as PEC layers, although it should be understood that in real embodiments, the conductive layers may have a small but nonzero electrical resistance. Moreover, the simulations are performed with the use of perfectly matched layer (PML) boundary conditions to avoid non-physical reflective effects.

FIGS. 3A-3B show example dispersion characteristics of refractive index and extinction coefficient of the photoresist (FIG. 3A) and silicon (FIG. 3B) considered during simulations.

In an example embodiment, a plurality of unit cells similar to cell 200 are arranged periodically with Floquet periodicity in the boundary conditions along X and Z. For given material properties of the system, the system's optical response is affected by its structural parameters, such as unit cell size (d), element height ($h_{element}$), element width ($d_{element}$), opening width (w) and angle of incidence ($\theta_{inc}$).

Figure 4:
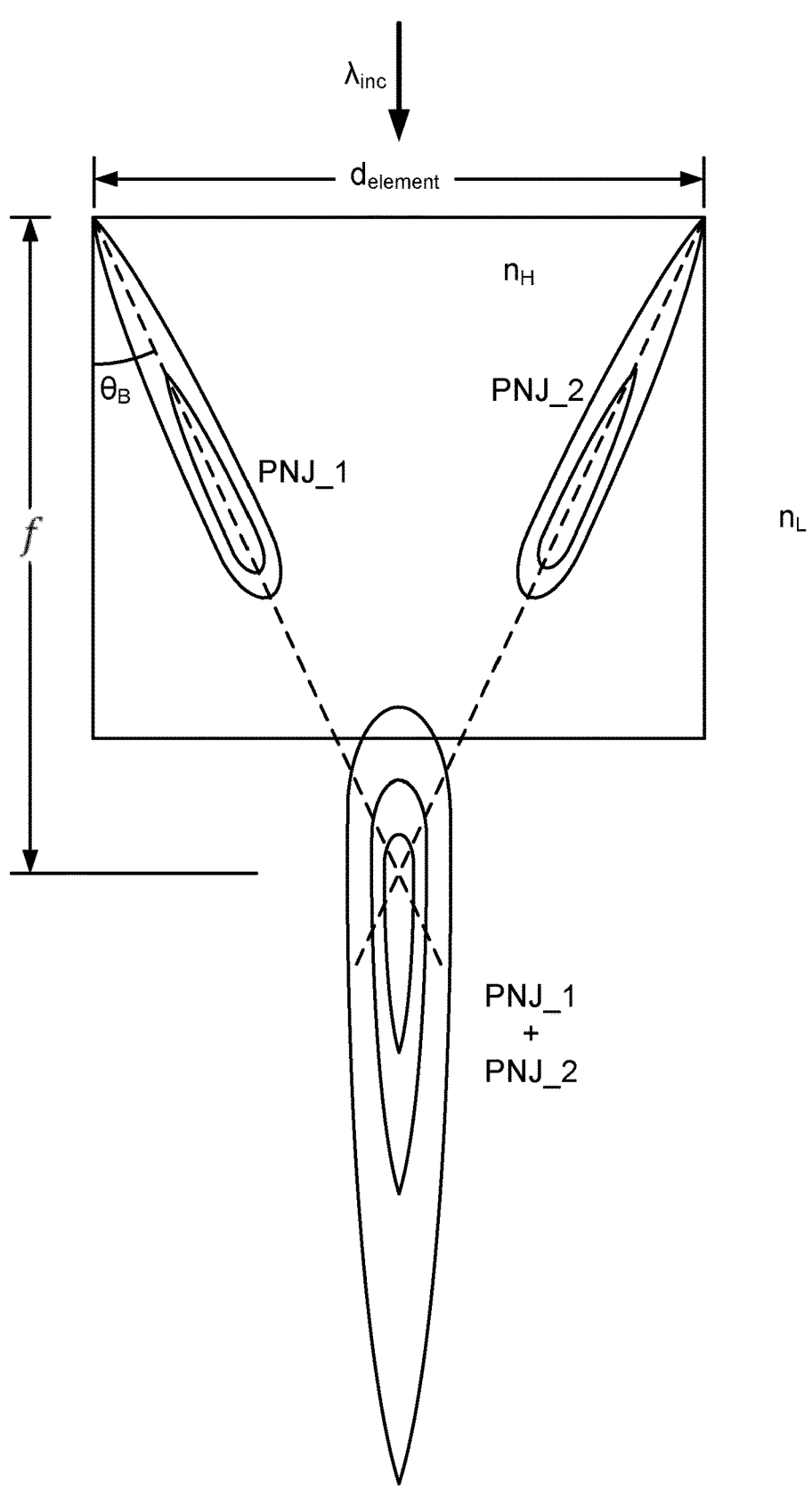
FIG. 4 is a cross-sectional schematic view of simulated power distribution for the case of two dielectric edges illuminated by a plane wave in some embodiments.

FIG. 4 is a schematic cross-sectional view of a power distribution for the case of two dielectric edges illuminated by a plane wave in some embodiments.

Diffraction of an incident plane wave (TE or TM) from the edges of a dielectric microstructure separating two media leads to a local light confinement (an optical hotspot) and local light deviation in the high-index medium, which may be referred to as a photonic nanojet (PNJ). This nanojet is a result of a combination of the incident electric field component and the longitudinal component created due to the edge. FIG. 4 illustrates an example of a structure combining two photonic nanojets (PNJ_1 and PNJ_2) originating from symmetrically opposite edges of a microstructure to form one single focused optical hotspot (PNJ_1+PNJ_2).

Referring to FIG. 4, the angle of the photonic nanojet (either PNJ_1 or PNJ_2) from the vertical depends on the ratio of the two refractive indexes around the edge and can be approximated as follows:

$$\theta_B \approx \frac{90° - \sin^{-1}\left(\frac{n_L}{n_H}\right)}{2}$$

The cross-point of two symmetrically opposite photonic nanojets generated by the edges of a rectangular block may be understood as a microlens whose focal length can be estimated using the following expression:

$$f = \frac{0.5 * d_{element}}{\tan(\theta_B)}$$

where $d_{element}$ represents the full width of the structure creating the combined photonic nanojet. For the case of normal incidence, the focal point will be located on the axis of symmetry of the microlens. The height of the dielectric block $h_{element}$ may be selected to be close to the critical height $h_c$, where $$h_c = \frac{\lambda_{inc}}{n_H - n_L}$$

Selection of a height $h_{element}$ close to the critical height $h_c$, may help to increase the intensity of the generated photonic nanojet.

The total width of the dielectric block may be selected starting from the condition that $f \geq h_{element}$, where f is the distance of the combined photonic nanojet from the base of the edges generating those nanojets. f may be referred to as the focal length of a photonic nanojet microlens This leads to the following expression:

$$d_{element} \geq \frac{2\lambda_{inc}\tan(\theta_B)}{n_H - n_L}$$

Some embodiments include conductive layers with openings that serve to create a substantially spherical wave due to diffraction that, upon proper choice of dimensions, may constructively interfere with the edge diffracted waves for a fixed wavelength at the output of the element.

Figure 5B:
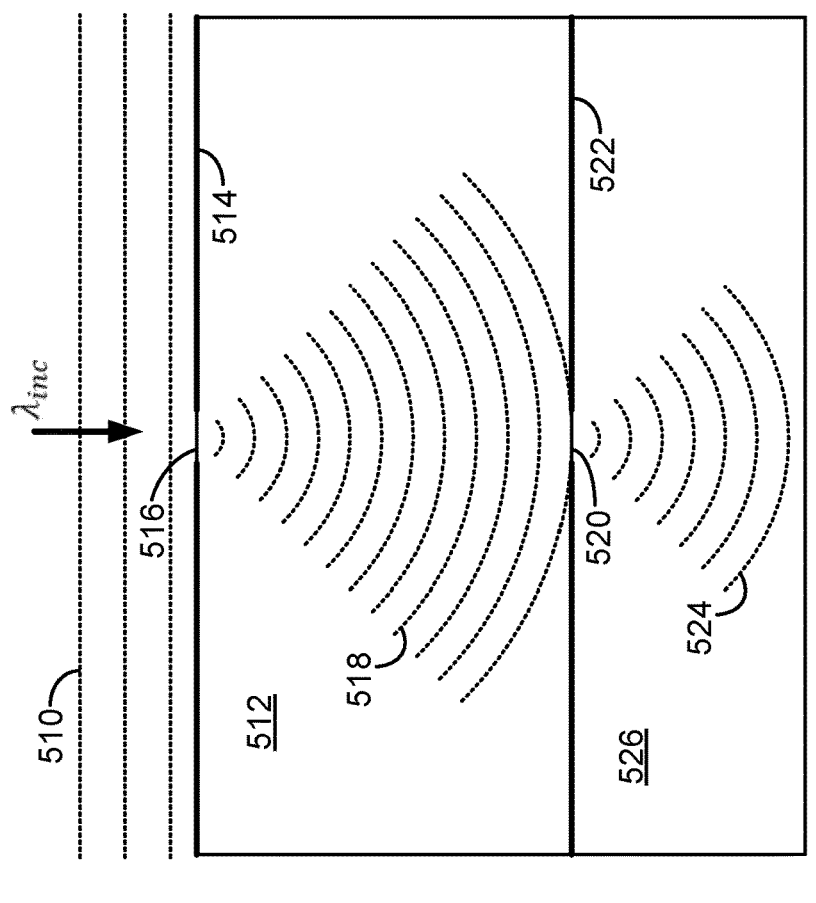
FIGS. 5A-5B are schematic illustrations of the creation of edge diffracted waves (FIG. 5A) and of spherical waves (FIG. 5B) by optical elements with conductive layers.
Figure 5A:
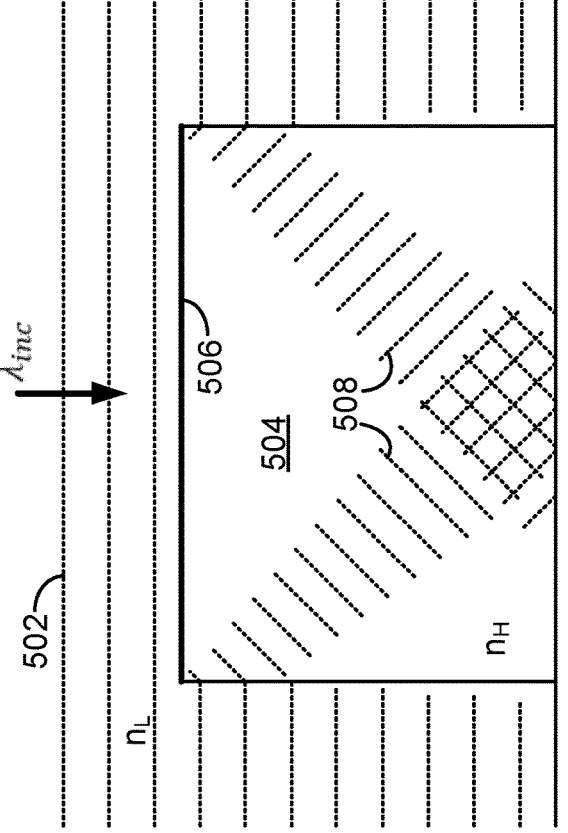
Figures 6A, 6B, 6C, 6D:
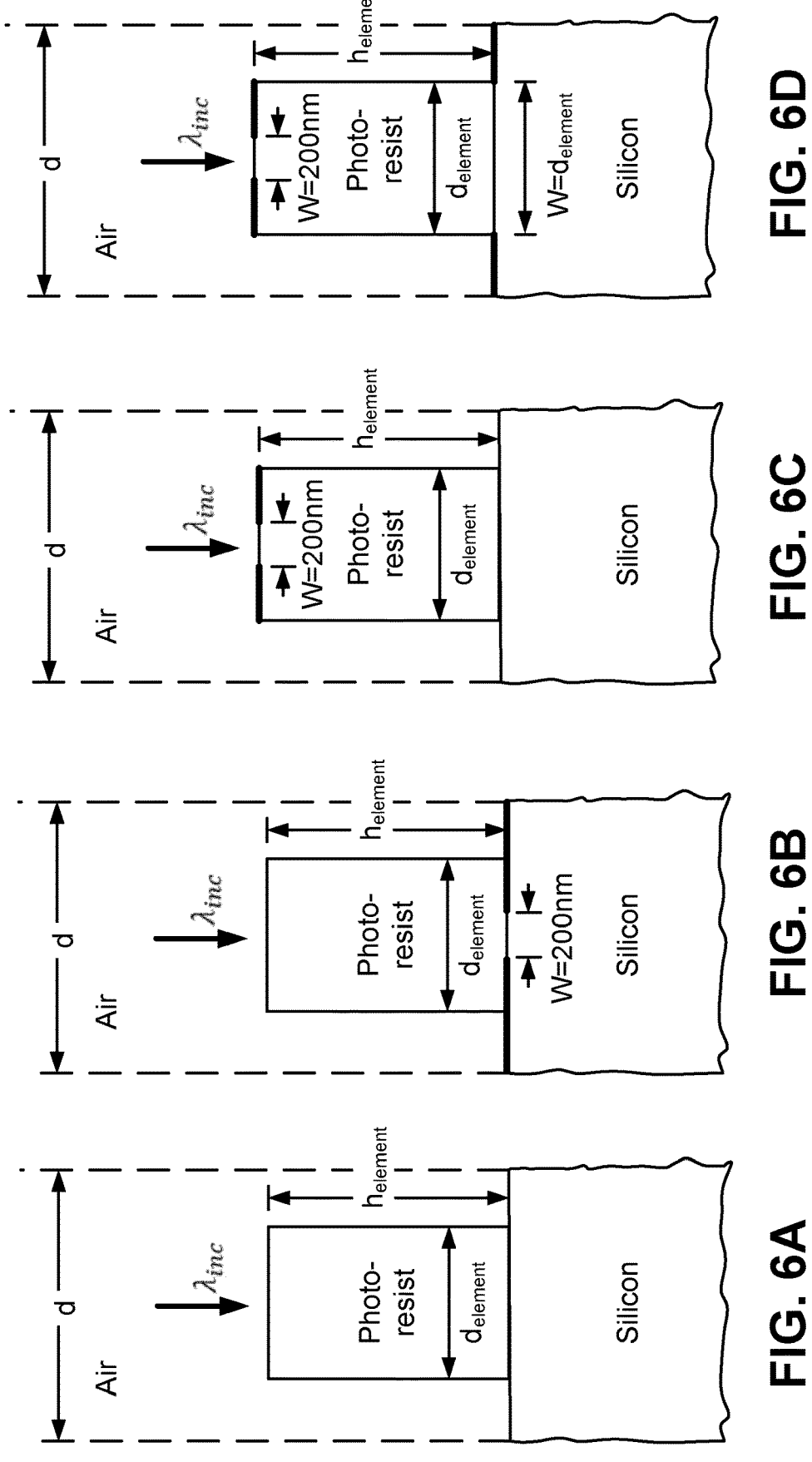
FIGS. 6A-6D are schematic cross-sectional views illustrating different configurations of an optical element with variations in the positions of conductive layers and openings therein.

FIGS. 5A-5B are schematic illustrations of a combination of edge diffracted waves and spherical waves that can lead to an increase in optical power at a fixed wavelength due to constructive interference between them. FIGS. 5A-5B illustrate principles of electric field distribution that may be employed in some embodiments.

FIG. 5A illustrates plane waves 502 incident on a dielectric element 504 covered with a conductive layer 506. The sides of the dielectric element 504 are not covered by the conductive layer. This configuration results in diffracted edge waves 508 that converge toward the center of the dielectric element.

FIG. 5B. illustrates plane waves 510 incident on a dielectric element 512 covered with a top conductive layer 514 in which a top opening 516 is provided. The top opening results in the propagation of spherical waves 518 through the element. An opening 520 in a bottom conductive layer 522 results in the propagation of additional spherical waves 524 through a substrate region 526.

Example embodiments operate to generate edge waves such as waves 508 of FIG. 5A together with spherical waves such as waves 518 of FIG. 5B and to combine those waves in a such a way that they interfere constructively for a desired wavelength.

The waves diffracted by the side edges of the element of an array interfere constructively with the spherical wave generated by the opening on the top of this element taking into account wave reflection by the conductive layers and the side surfaces of the element. Some embodiments achieve this constructive interference for $\lambda_{inc}$=940 nm to increase the amount of light that reaches the silicon photodetector below and gets absorbed, thereby increasing its absorption capability for that wavelength.

FIGS. 6A-6D illustrate different configurations of an optical system with variations in the positions of conductive layers and openings therein.

Figure 7A:
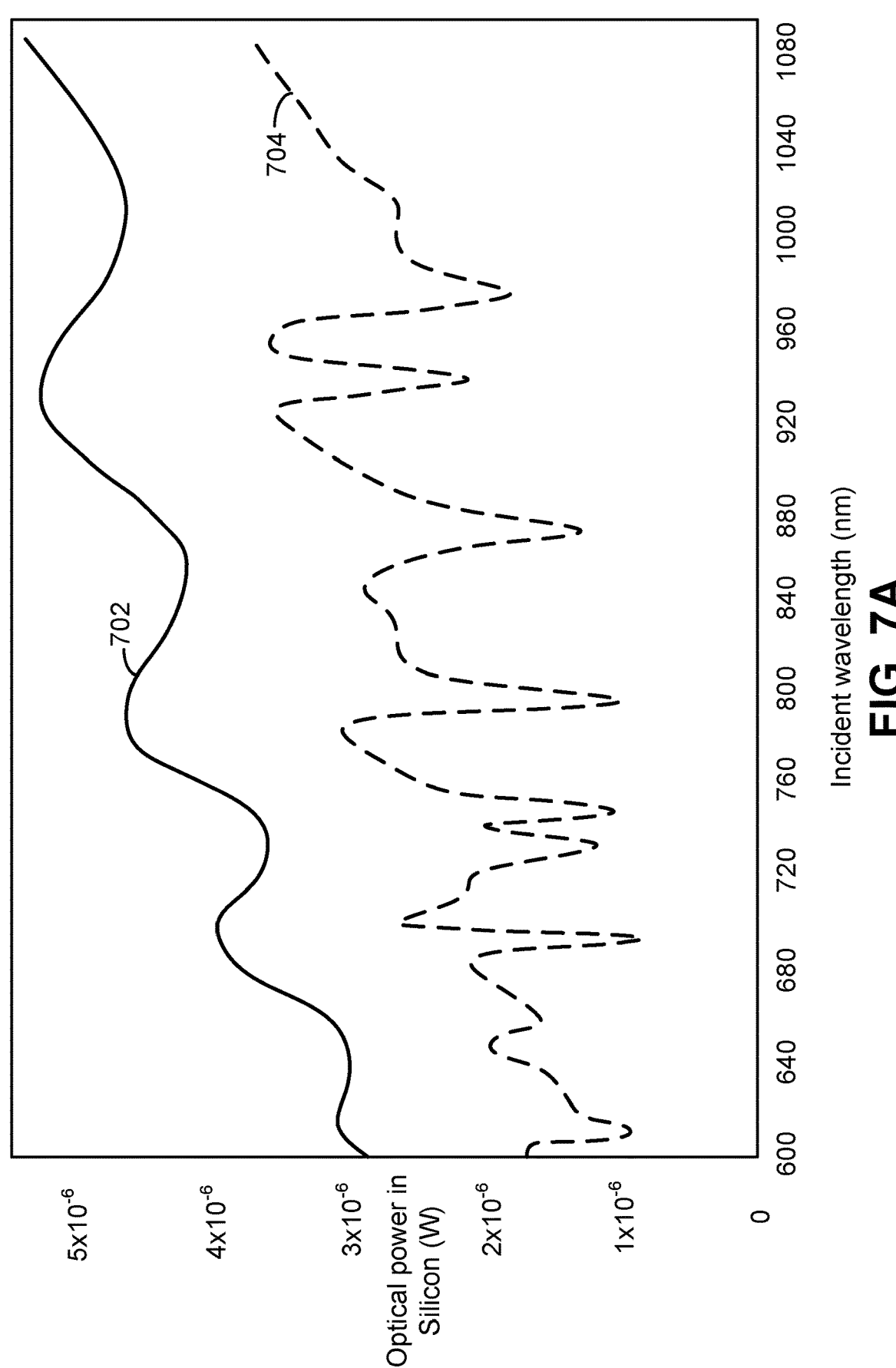
FIGS. 7A-7B are graphs illustrating spectral variation of optical power in silicon for the optical elements of FIGS. 6A-7D.
Figure 7B:
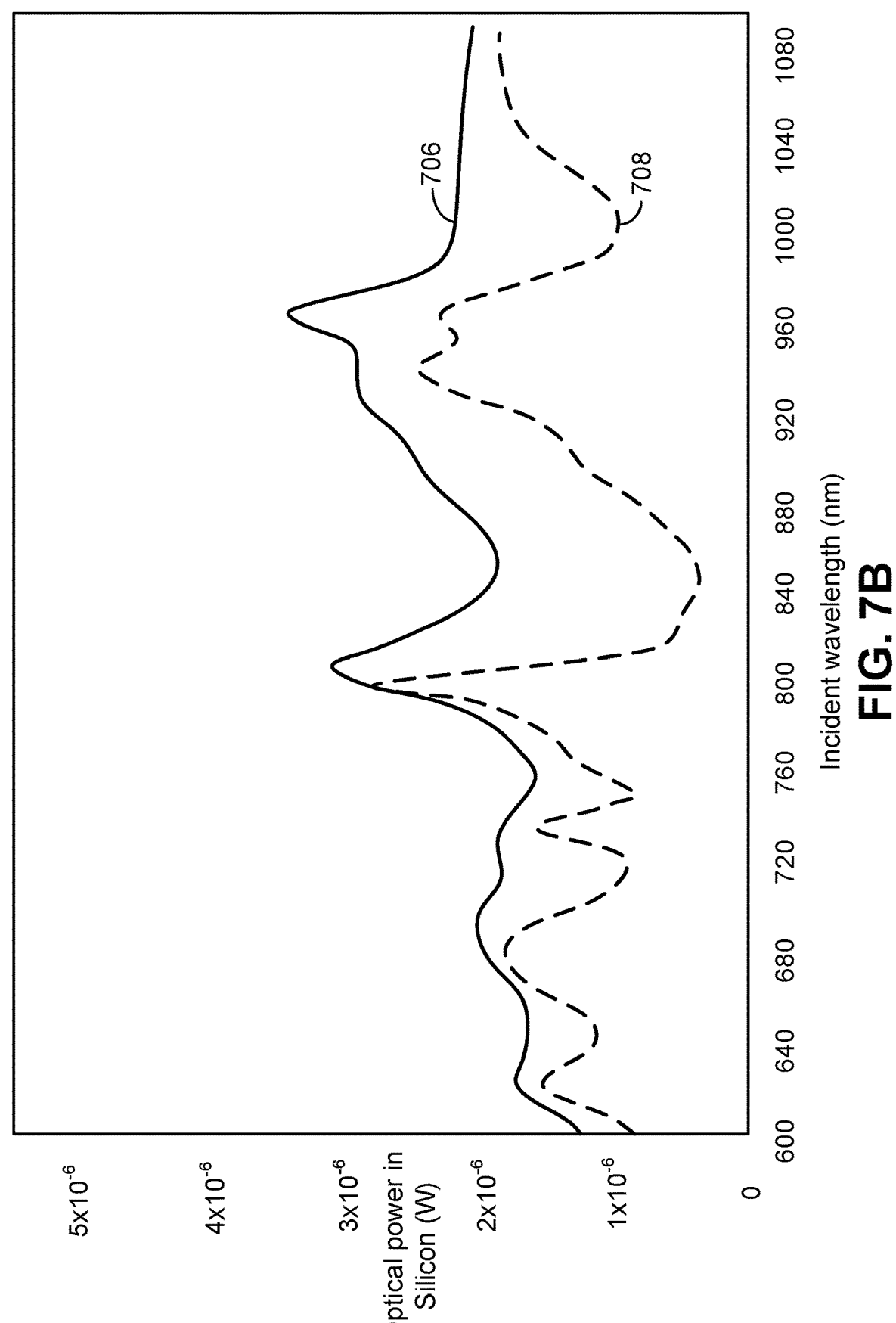

FIGS. 6A-6D illustrate the functionality of using conductive layers with openings in different configurations for a fixed topology with the following physical dimensions: d=2300 nm, $d_{element}$=1350 nm, $h_{element}$=1750 nm. The spectral characteristic of each case is presented in FIGS. 7A-7B. For a system with no conductive layer (FIG. 6A) we observe in curve 702 of FIG. 7A a relatively uniform increase of optical power in silicon as a function of the incident wavelength, which is not necessarily desirable for a wavelength-selective system. Next, for the case of only one conductive layer with an opening, either below (FIG. 6B) or above (FIG. 6C) the unit cell element, we still do not observe substantial resonant dependence of the optical power for a fixed incident wavelength, as seen in curve 704 (corresponding to the cell FIG. 6B) and curve 706 (corresponding to the cell of FIG. 6C). The same lack of substantial resonance is observed in curve 708 for the case of FIG. 6D, in which two conductive layers with openings are provided, but where the opening on the bottom layer extends across the entire unit cell element.

Figure 8:
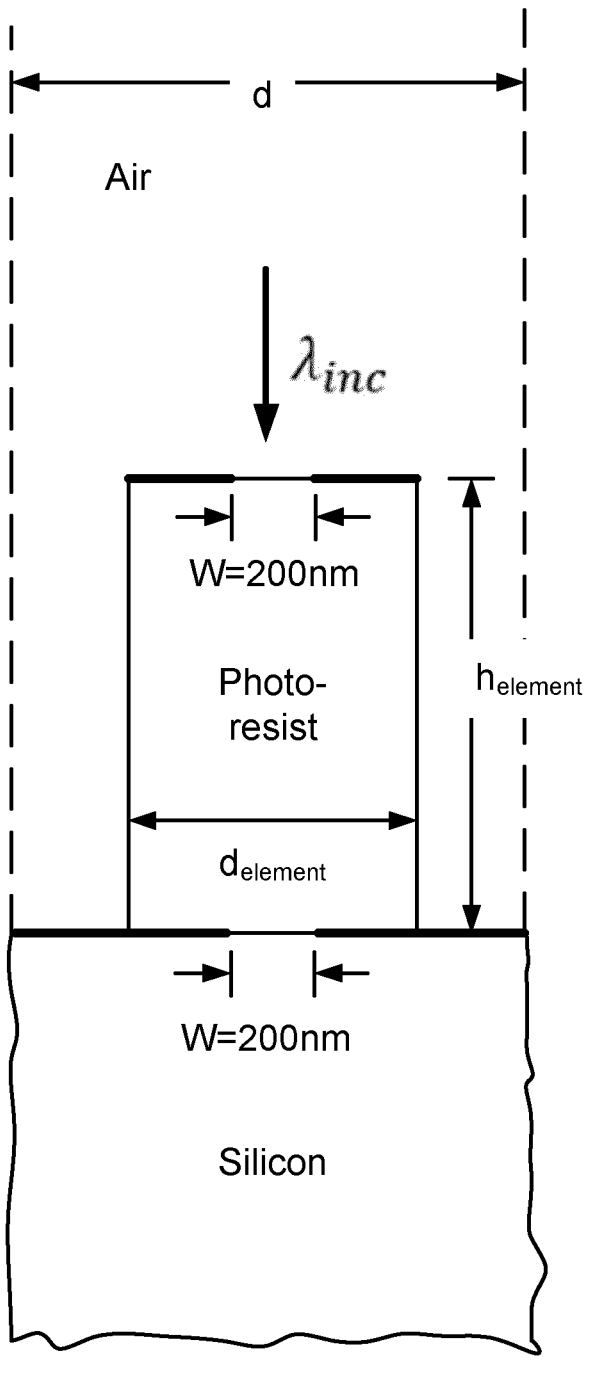
FIG. 8 is a schematic cross-sectional view illustrating a configurations of an optical element according to some embodiments.

FIG. 8 is a schematic cross-sectional illustration of a unit cell having conductive layers both above and below the unit cell element and openings of 200 nm. This example demonstrates around a 3.5 times increase in the concentration of optical power for the peak wavelength as compared to other wavelengths.

Figure 9:
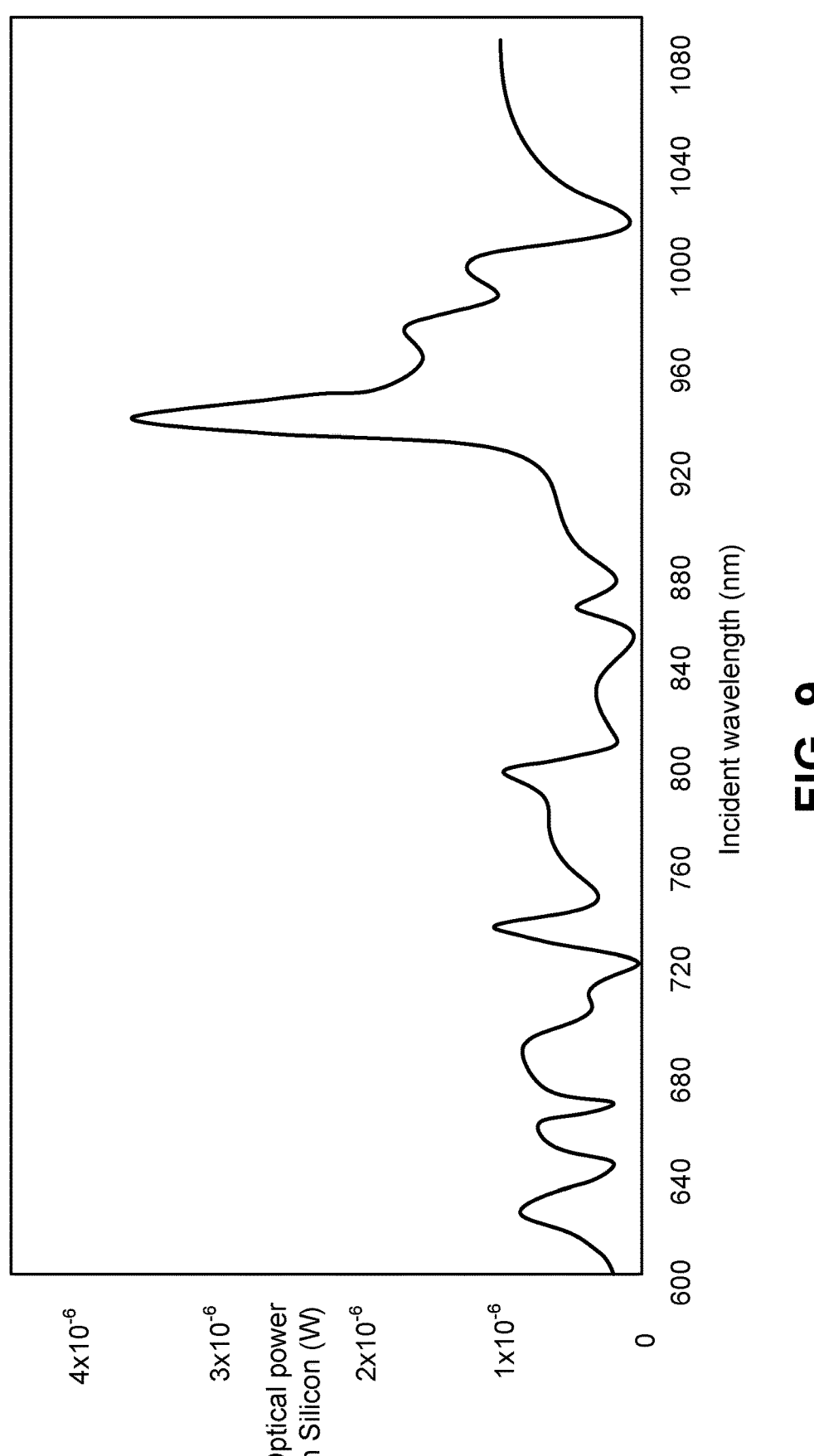
FIG. 9 is a graph illustrating spectral variation of optical power in silicon for the geometrical configuration of FIG. 8 with openings in the conductive layer having equal width (=200 nm) on the top and bottom surface of the dielectric element.

FIG. 9 is a graph illustrating spectral variation of optical power in silicon for the embodiment of FIG. 8 as determined by a simulation. As seen in FIG. 9, there is a strong peak in the near infrared region at a wavelength near $\lambda_{inc}$=940.

Figure 10:
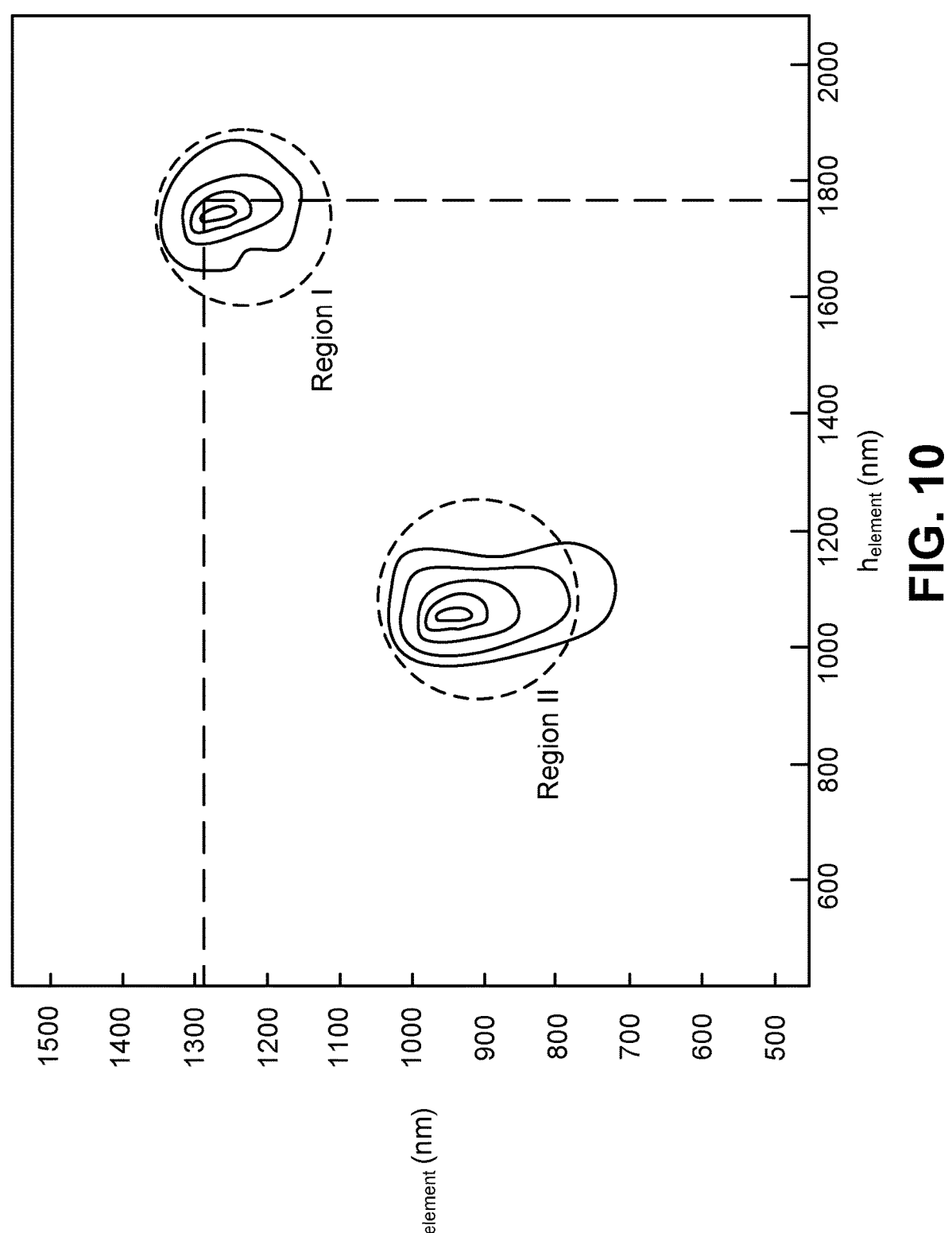
FIG. 10 is a schematic visualization of simulated optical power in silicon substrate for different values of $h_{element}$ and $d_{element}$ for a unit cell width d=2300 nm and PEC slit width, w=400 nm for $\lambda_{inc}$=940 nm.

FIG. 10 is a schematic illustration of simulation results of optical power in a silicon substrate for different values of $h_{element}$ and $d_{element}$ for unit cell width d=2300 nm and slit width, w=400 nm for $\lambda_{inc}$=940 nm.

The influence of parametric variations on the optical response of the system was studied by performing numerical simulations in COMSOL Multiphysics software. The simulations use a TM polarized plane wave and measure the optical power inside a 3 μm thick silicon substrate by computing the magnitude of the Poynting vector (optical power). FIG. 10 schematically shows the peak regions in the optical power distribution for variations of the element height, $h_{element}$ and the element width $d_{element}$ for a starting value of unit cell width, d=2300 nm at 940 nm. Two regions of interest demonstrate high optical power in silicon namely, Region I and Region II in the figure. Analyzing the coordinates of Region I, it may be noted that $h_{element}$ lies in proximity to the critical height of the element. Region I generally encompasses a height $h_{element}$ between about 1600 nm and 1900 nm and a width $d_{element}$ between about 1100 nm and 1400 nm. Region II generally encompasses a height $h_{element}$ between about 900 nm and 1300 nm and a width $d_{element}$ between about 750 nm and 1050 nm.

Figure 11:
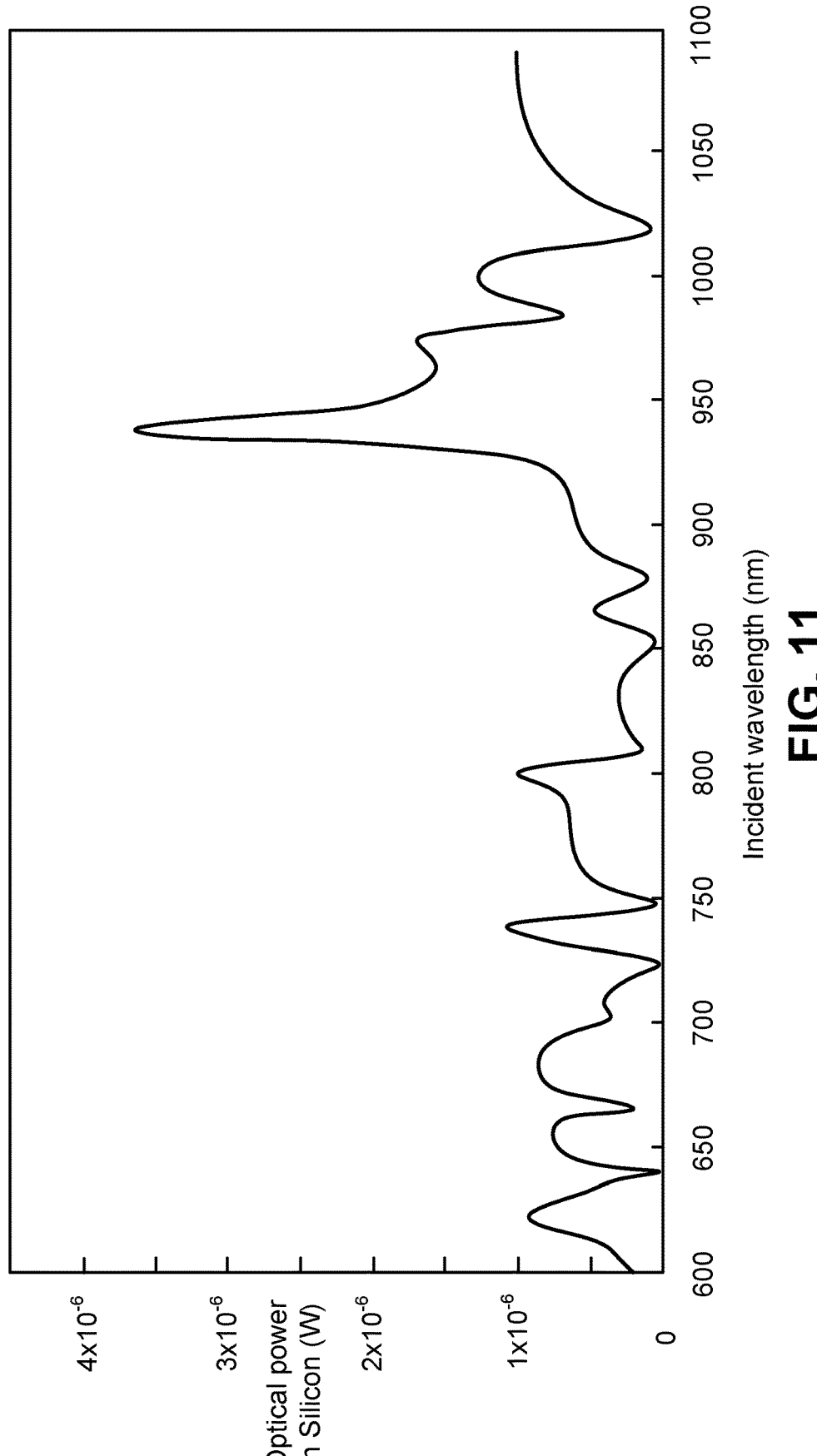
FIG. 11 is a graph illustrating spectral dependence of optical power in silicon for a system using parameters around Region I of FIG. 10 at normal incidence.

FIG. 11 is a graph illustrating spectral dependence of optical power in silicon for a system optimized around Region I of FIG. 10 at normal incidence as determined by simulation. In the simulated element, the lateral size of the cell is 2300 nm, the element width is 1350 nm, the element height is 1750 nm, and the openings in the conductive layer have a width of 200 nm.

Simulating the structure corresponding to Region I results in the spectral distribution shown in FIG. 11. There is an increase in the optical power in silicon centered at $\lambda_{inc}$=939.8 nm compared to the power at other wavelengths.

Figure 12:
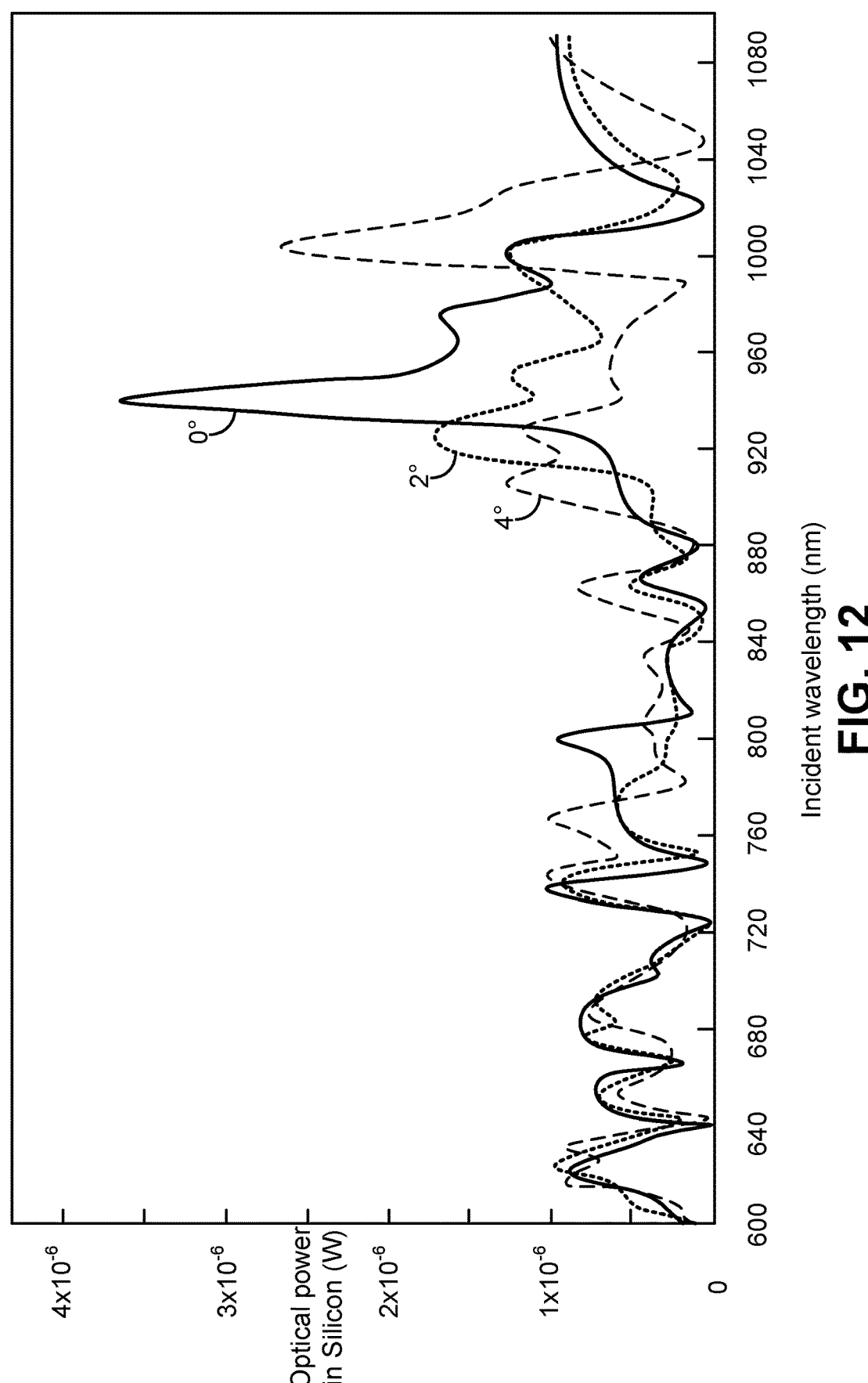
FIG. 12 is a graph illustrating spectral variation of optical power in silicon for different incident angles corresponding to physical parameters of Region I in FIG. 10.

FIG. 12 is a graph illustrating spectral variation of optical power in silicon for different incident angles corresponding to physical parameters of Region I in FIG. 10.

FIG. 12 illustrates the results of a simulation showing the influence of incident angle variation on the optical power in silicon for incident angles 0°, 2°, and 4°. As seen from FIG. 12, the optical power in silicon is strongly dependent on the incident angle. The effect may be described as the peak splitting into two smaller peaks as the angle of incidence deviates from the normal incidence. This effect indicates that selecting physical parameters in Region I may result in embodiments that are less robust for use in practical applications.

Figure 13:
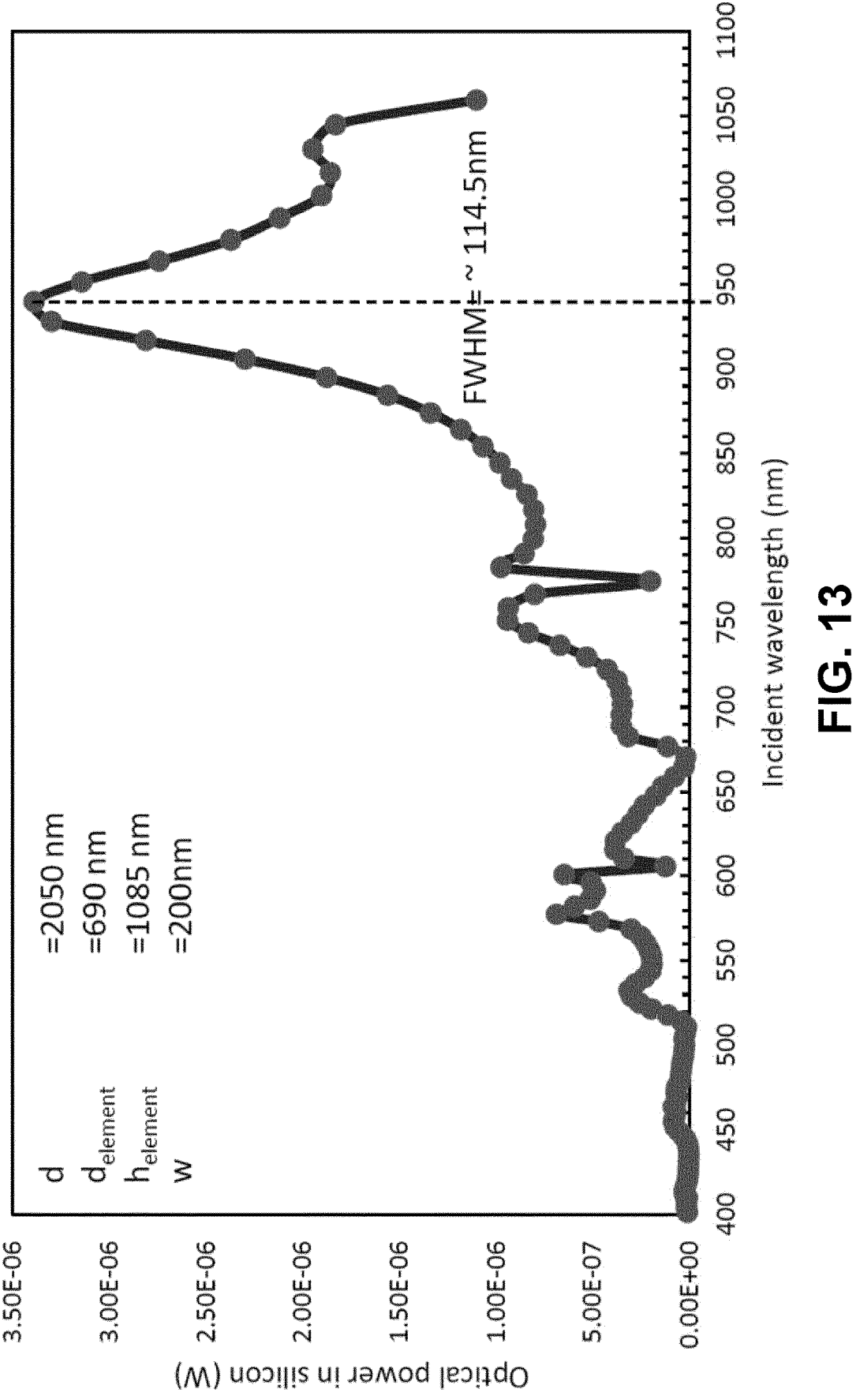
FIG. 13 is a graph illustrating simulated spectral variation of optical power in silicon for a unit cell with dimensions d=2050 nm, $d_{element}$=690 nm, $h_{element}$=1085 nm, and w=200 nm.

With reference to Region II in FIG. 10, the values of the element height, $h_{element}$ and element width, $d_{element}$ are almost half of the ones in Region I. FIG. 13 shows the optical power in silicon for a set of physical parameters around Region II configured to filter in a range of wavelengths centered at 939.8 nm. FIG. 13 is a graph illustrating simulated spectral variation of optical power in silicon for an embodiment of a unit cell with dimensions d=2050 nm, $d_{element}$=690 nm, $h_{element}$=1085 nm, and w=200 nm.

Figures 14A, 14B, 14C:
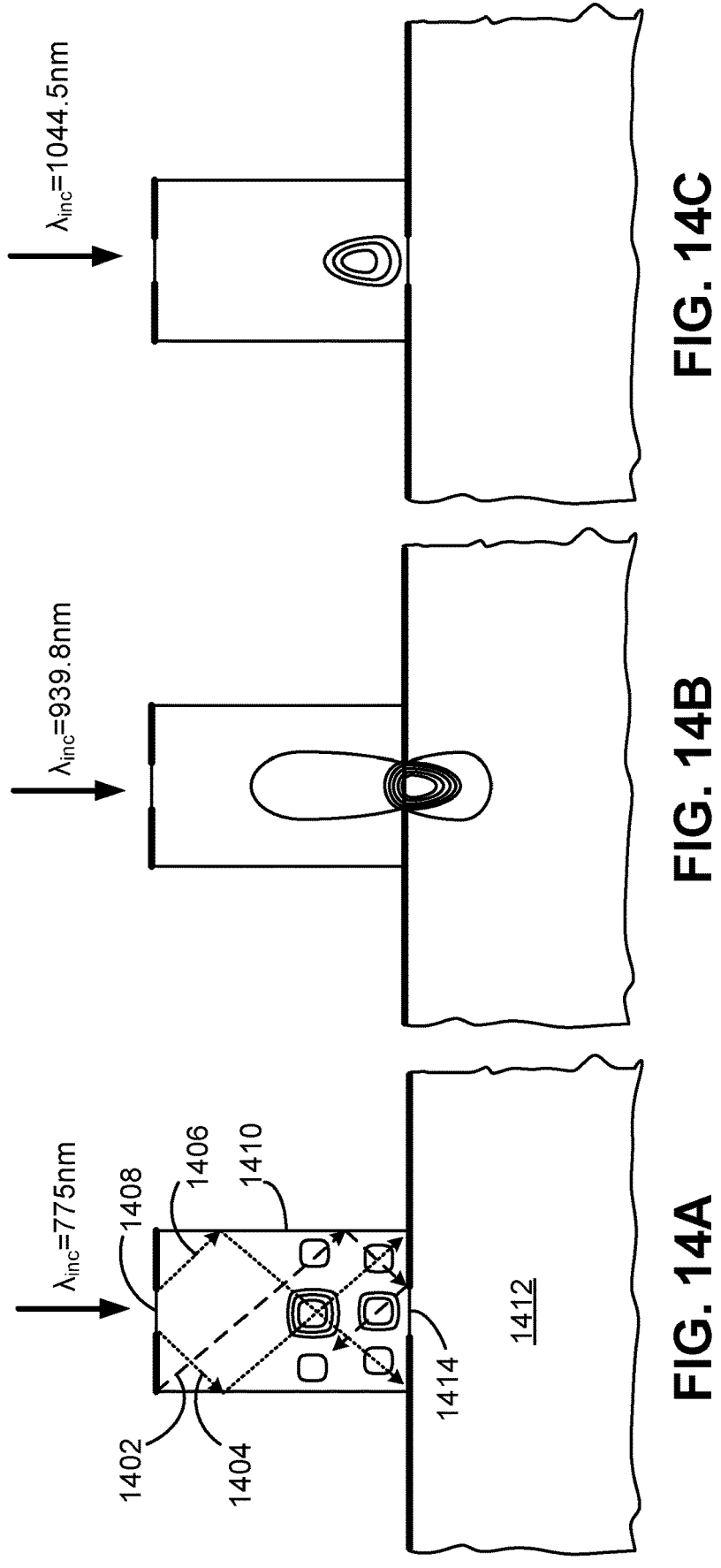
FIGS. 14A-14C illustrate optical power redistribution for off-resonance wavelengths (FIGS. 14A and 14C) and the resonant wavelength (FIG. 14B) of an optical component according to some embodiments.

FIGS. 14A-14C illustrate optical power redistribution at off-resonance wavelengths (775 nm in FIG. 14A and 1044.5 nm in FIG. 14C) and the center resonant wavelength (939.8 nm in FIG. 14B) showing interaction of the waves originating from the edges and the spherical wave from the opening in the top conductive layer. FIG. 14A shows the optical trajectory 1402 of edge waves originating from the left edge of the element (a similar but symmetrically opposite trajectory will be pursued by the edge waves originating from the right edge, but they are not illustrated in the figure for clarity). These edge waves from the left and right side surfaces of the element are reflected by the side surfaces and bounce back and forth and interfere with the spherical waves (illustrated by trajectories 1404, 1406) originating from the opening 1408 in the upper conductive layer.

Contour lines drawn in FIGS. 14A-14C illustrate the regions where the edge waves and the spherical waves are in phase and interfere constructively. As is seen in FIG. 14B, the parameters of the system can be selected such that these waves interfere constructively at the opening 1414 in the bottom conductive layer for the desired wavelength (e.g. 940 nm) to generate a high optical power in the silicon substrate 1412.

FIGS. 14A-14C show the effect of conductive layers on achieving resonance as they not only reflect the unwanted waves from entering the silicon photodetector, but also help in strengthening the optical hotspot at the opening in the bottom conductive layer due to constructive interference of generated nanojets with the spherical wave. Plasmonic surface waves may be generated at the boundaries of the conductive layers.

Changes to the incident angle of light, the width of the openings in the conductive layers, and the unit cell width, may also lead to changes in the optical power in silicon.

Figure 15:
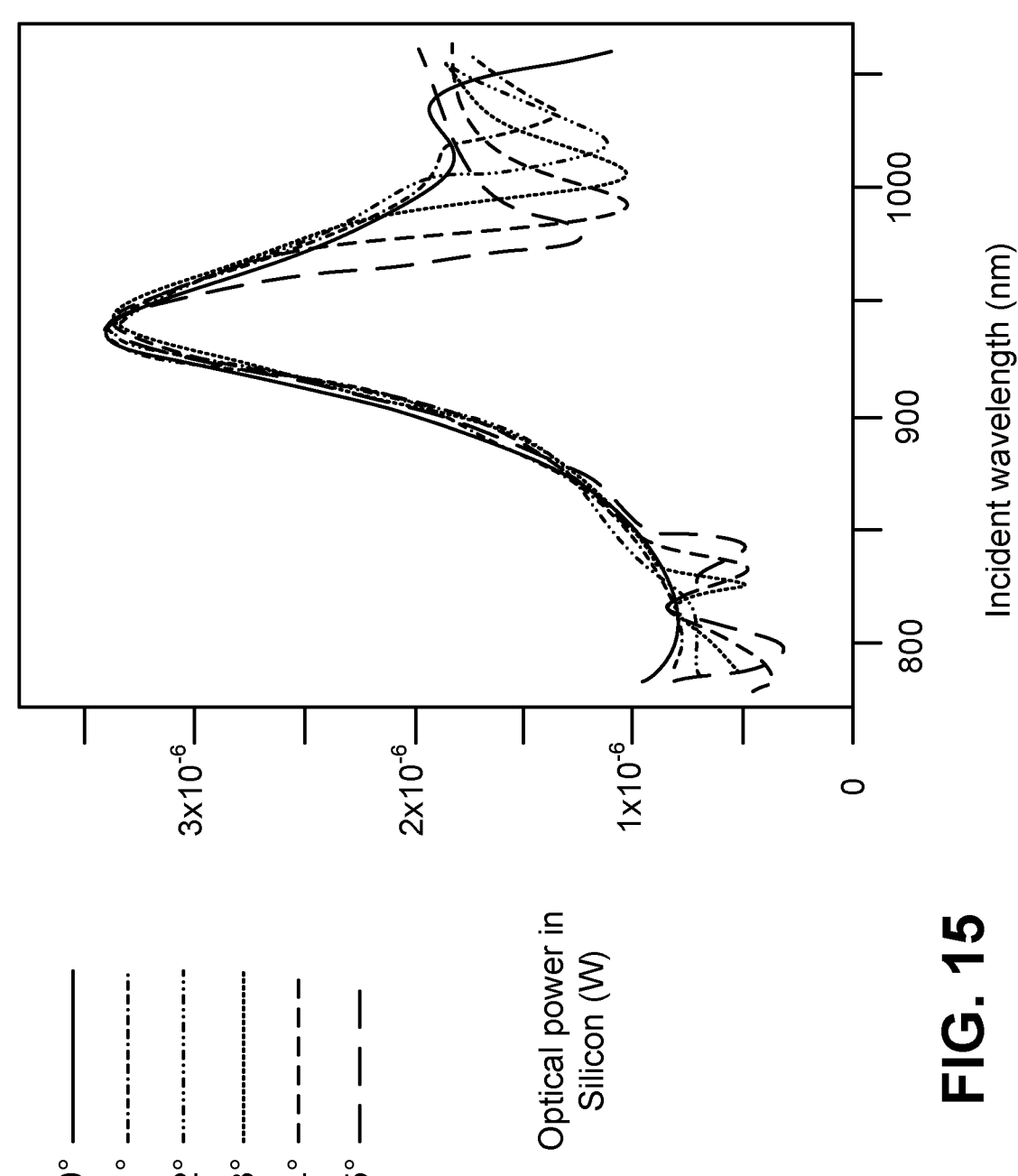
FIG. 15 is a graph illustrating spectral variation of optical power in silicon for different angles of incident light.
Figure 16:
FIG. 16 is a graph illustrating the full width half maximum of the optical power peak at 940 nm as function of incident angle in an example embodiment.
Figure 16:

FIG. 15 is a graph illustrating the simulated optical power in silicon for different angles of incident light. There is a good tolerance of the peak position and peak intensity to the incident angle from 0 to +5°. Because the simulated structure is symmetric around a vertical axis, the system may be understood to be tolerant for 0 to −5° incidence as well. As the angle of incidence increases, the width of the resonance peak decreases, which may be understood as an effect of the finite width of the opening in the bottom conductive layer. The wavelengths that constructively interfered for 0° incidence get blocked for oblique incidence causing this decrease in the peak width. FIG. 16 shows this variation as plot of the full width half maximum (FWHM) of the peak centered at 939.8 nm as a function of the angle of incidence. For normal incidence, the FWHM is its maximum at 128 nm (approx.) which drops to 70 nm (approx.) for an incidence of 5°.

Simulations have been used to investigate the spectral variation of optical power in silicon for different values of unit cell width, d. Little change is seen in the spectral position of the peak as the unit cell width changes. The aspect ratio of the unit cell element and the width of the openings in the conductive layer appear to have a much greater effect on the optical power.

Figure 17:
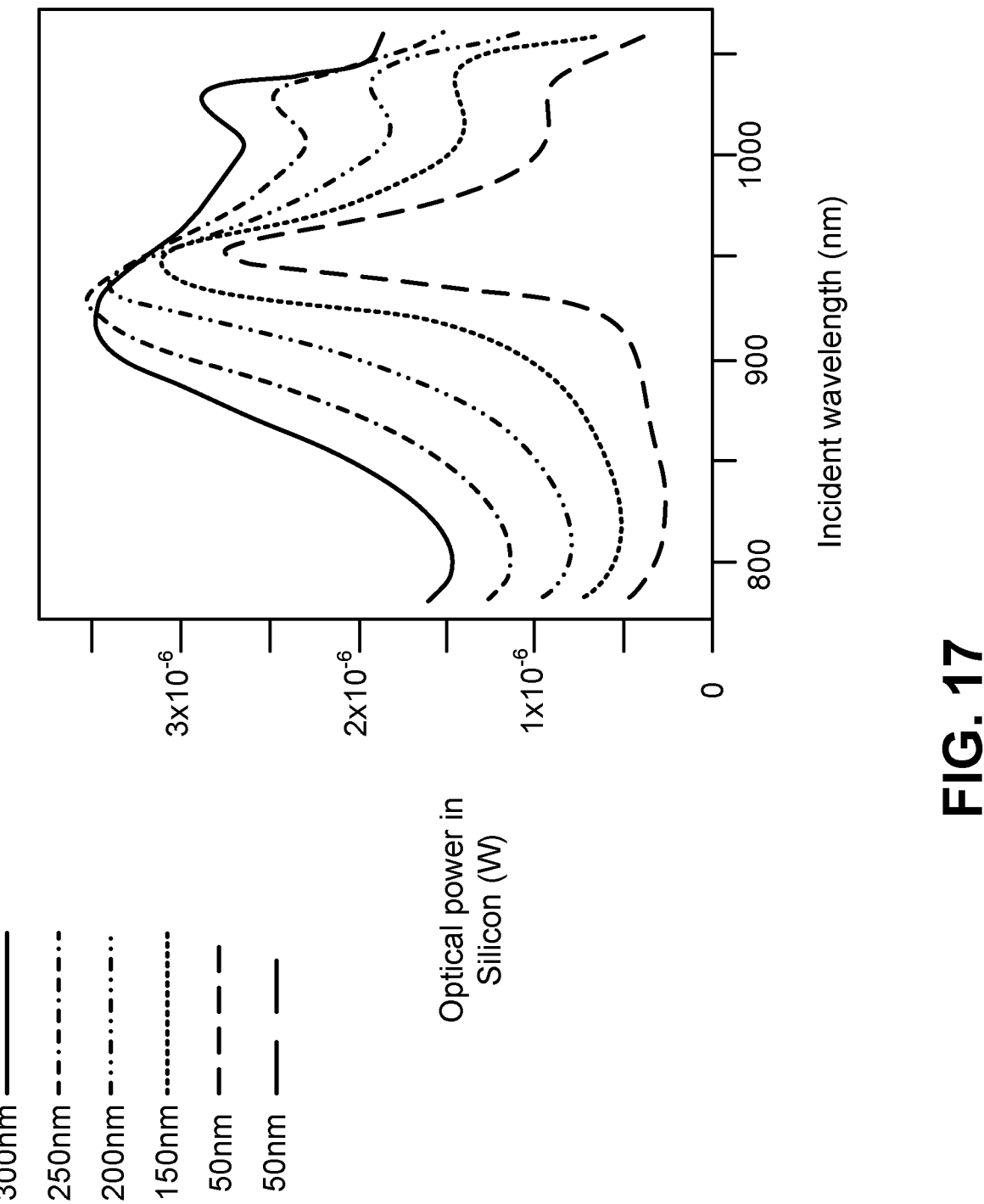
FIG. 17 is a graph illustrating spectral variation of optical power in silicon for different widths w of the openings in the conductive layers.

FIG. 17 is a graph illustrating spectral variation of optical power in silicon for different widths w of the openings in the conductive layers. In FIG. 17, changes are visible to the peak wavelengths and the full width half maximum of the optical power peak as the slit width changes. The central wavelength of the peak decreases relatively linearly from 963.9 nm for a slit width of 50 nm to 920 nm corresponding to a slit width of 300 nm.

Figure 18:
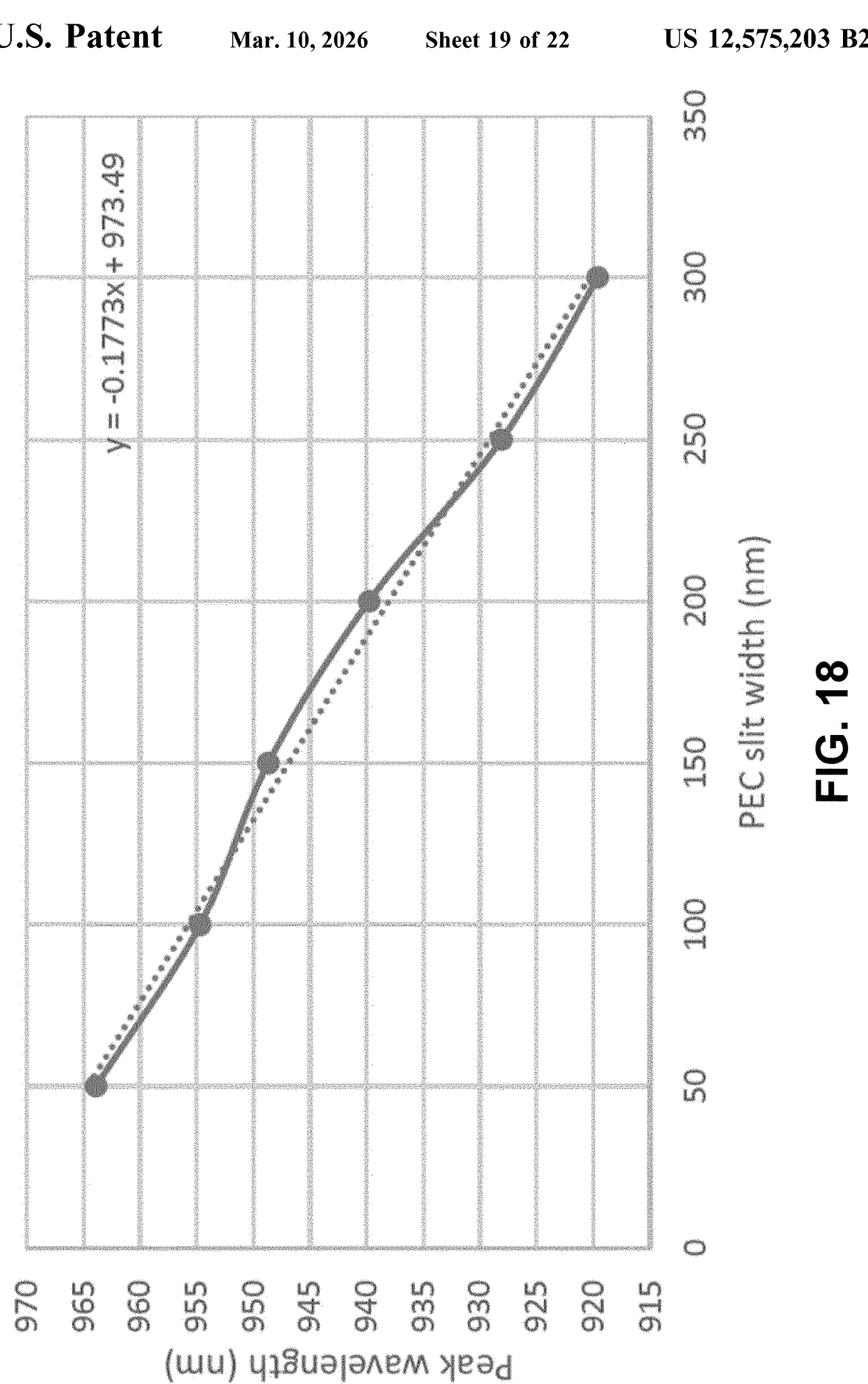
FIG. 18 is a graph illustrating influence of widths of the openings in the conductive layer on the spectral position of the central wavelength.

FIG. 18 is a graph illustrating influence of widths of the openings in the conductive layer on the spectral position of the central wavelength.

The FWHM of the peak increases from 21.7 nm for opening widths of 50 nm to 114.5 nm corresponding to opening widths of 200 nm. Table 1 summarizes these two results.

TABLE 1

| FWHM and central wavelength position for different opening widths. | | |
|---|---|---|
| PEC slit widths (nm) | FWHM (nm) | Spectral position of central wavelength (nm) |
| 50 | 21.7 | 963.9 |
| 100 | 42.8 | 954.7 |
| 150 | 73.6 | 948.7 |
| 200 | 114.5 | 939.8 |
| 250 | — | 928.1 |
| 300 | — | 919.3 |

In some embodiments, the width of the slits or other openings in the top and bottom surface of the element is between 150 and 250 nm. In some embodiments, the width of the slits or other openings in the top and bottom surface of the element is between 50 and 300 nm.

Figure 19:
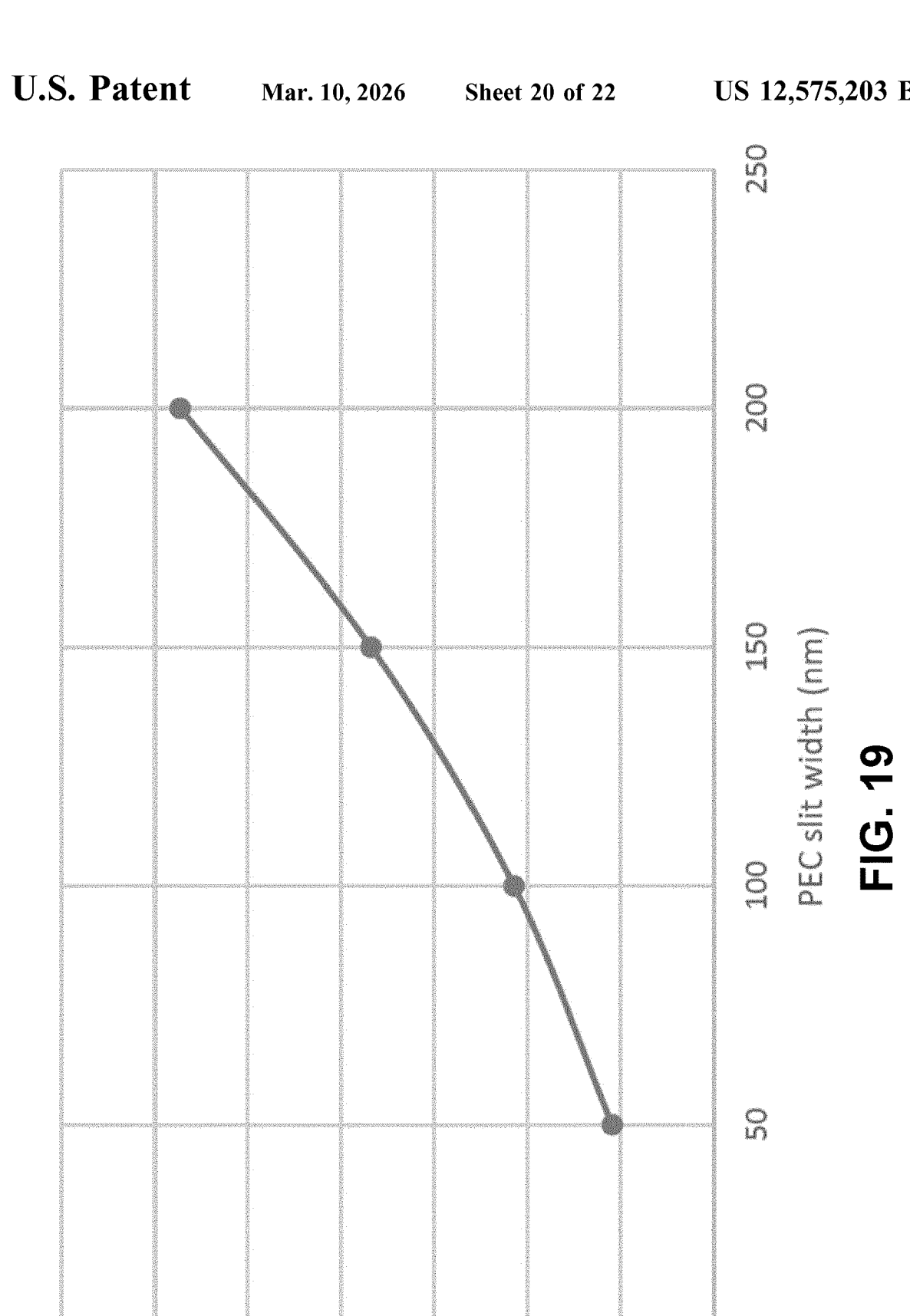
FIG. 19 is a graph illustrating effects of the width of openings in the conductive layers on the FWHM of the corresponding peak.
Figure 20A:
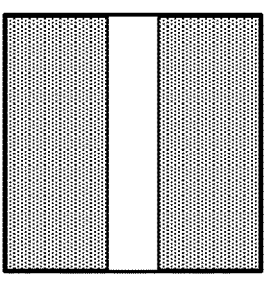
FIGS. 20A-20F are schematic top views of example optical components according to some embodiments.
Figure 20B:
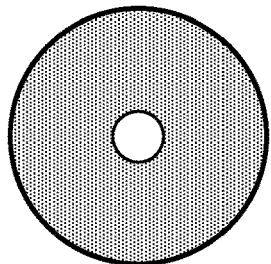
Figure 20C:
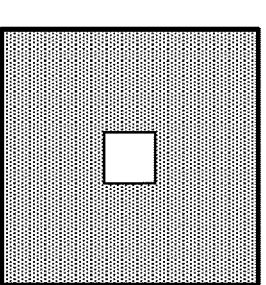
Figure 20D:
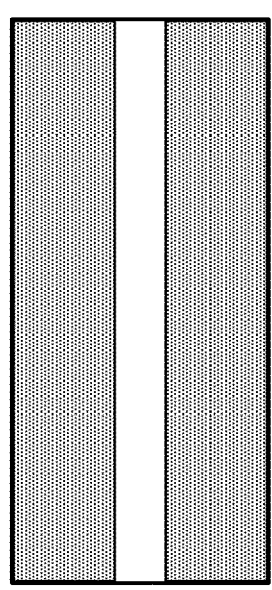
Figure 20E:
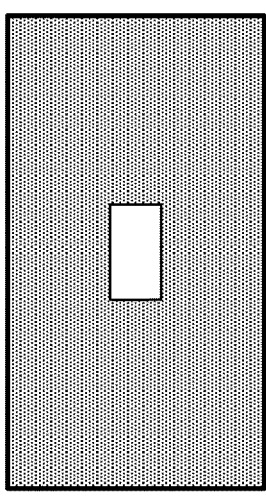
Figure 20F:
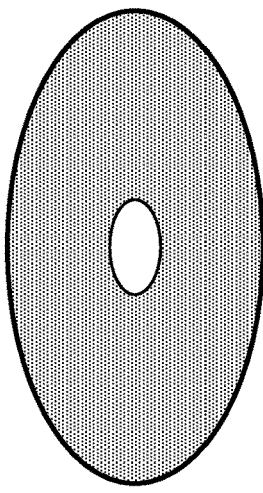

FIG. 19 is a graph illustrating effects of the width of openings in the conductive layers on the FWHM of the corresponding peak.

Simulations have been conducted to determine the optical power in silicon for different values of the conductive layer opening widths and different incident angles for 940 nm incident light. It has been found that for incident light with angles between −5° and 5°, widths from around 180 nm to around 230 nm may be used in some embodiments for obtaining high optical power in silicon. Other embodiments may use values outside this range to achieve other properties.

Example embodiments provide a unit cell element design that may be employed with a silicon photodetector. Some embodiments exploit constructive interference phenomena between edge diffracted waves and spherical waves to increase the optical power reaching the silicon layer for a waveband centered around a selected wavelength, such as $\lambda_{inc}$=939.8 nm. Some such embodiments use a unit cell width d of 2050 nm. Some embodiments include an element of a photopolymer material with a width of 690 nm and a height substantially equal to $0.6*h_c$, where $h_c$ is the critical height, with $$h_C = \frac{\lambda_{inc}}{n_H - n_L}$$

In some embodiments, a conductive layer is provided at the top and bottom of the photopolymer element, and openings with a width of 200 nm are provided in the conductive layers. Such embodiments may be well adapted for incident wave angles from −5° to +5°.

Different parameters may be selected in different embodiments to vary the spectral behavior of the unit cell. Parameters such as $h_{element}$, $d_{element}$, and width w of openings in the conductive layers. In some embodiments, the top opening and the bottom opening have different widths. Varying these parameters can modify the spatial patterns of constructive interference and consequently, the central resonant wavelength. The unit cell width d has been found to have little influence on the spectral form of optical power in silicon, and small variations observed in optical power may be attributable to the crosstalk on account of the periodic boundary conditions of the unit cell.

Different embodiments may also have different configurations as viewed from above, as seen in FIGS. 20A-20F. In FIGS. 20A-20F, the shaded portions represent portions of the optical element that are covered by a conductive layer, while the unshaded portions represent openings in the conductive layer (referred to as PEC slits with regard to the simulations). The openings in the upper electrically conductive layer and the lower electrically conductive layer may have the same size, shape, and orientation, or they may have different sizes, shapes, and/or orientations. Various combinations of round, square, oval, rectangular, and other shapes may be used for the optical element and for the opening in the conductive layer.

Figure 21:
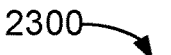
FIG. 21 is a cross-sectional schematic diagram of an optical component unit cell according to some embodiments.

In some embodiments, the sides of the optical element have an angle or angles other than 90° with respect to the substrate. As an example, FIG. 21 is a cross-sectional schematic diagram of a unit cell 2300 according to some embodiments. Unit cell 2300 includes an element 2302 that is rectangular in cross section. Element 2302 may be made of a commercially available polymer photoresist, such as Microchem495 PMMA. Element 2302 may be provided on a silicon substrate 2304. The silicon substrate 2304 may include a CMOS sensor or other photodetector. Electrically conductive layers 2306 and 2308, which may be metal layers, are provided above and below the rectangular element 2302. The electrically conductive layers 2306 and 2308 include respective openings 2310, 2312. In the example of FIG. 21, the side surfaces 2314, 2316 of the element 2302 are at an angle α with the substrate that is different from 90°. In some embodiments, α is between 80° and 100°. In some embodiments, a is between 70° and 90°.

In some embodiments, the unit cells as described herein are arranged in a two-dimensional array. In some embodiments, a photodetector (e.g. a pixel of a CMOS sensor) underlies each of the unit cells.

While the above examples refer primarily to the use of devices configured for near infrared light, other embodiments are configured for use with longer or shorter wavelengths, such as far infrared, visible light, or ultraviolet light, or for use with waves in other parts of the electromagnetic spectrum. Such embodiments may employ materials that are transparent to the wavelengths for which they are designed.

Although features and elements are described above in particular combinations, one of ordinary skill in the art will appreciate that each feature or element can be used alone or in any combination with the other features and elements.

What is claimed:

1. An optical component comprising:
a substantially rectangular dielectric element having an upper surface, a lower surface, and at least one side surface, the dielectric element being arranged on a silicon substrate;
a first electrically conductive layer disposed on the upper surface of the dielectric element, the first electrically conducting layer having a first opening of a first width configured to accept incident electromagnetic radiation; and
a second electrically conductive layer disposed between the lower surface of the dielectric element and a top surface of the silicon substrate, the second electrically conductive layer having a second opening of a second width configured for emission of the incident electromagnetic radiation of a selected wavelength determined by the first width and the second width into the silicon substrate,
wherein the incident electromagnetic radiation undergoes diffraction at the at least one side surface of the dielectric element and at the first opening in the first electrically conductive layer and at the second opening in the second electrically conductive layer, such that diffracted electromagnetic radiation waves interfere constructively with spherical electromagnetic radiation waves generated at the first opening, taking into account reflections from the first electrically conductive layer, the second electrically conductive layer, and the at least one side surface of the dielectric element, thereby creating a focused optical hotspot in the silicon substrate.

2. The optical component of claim 1, wherein the first width and the second width are substantially the same.

3. The optical component of claim 1, wherein the first opening and the second opening are substantially centered on the dielectric element.

4. The optical component of claim 1, wherein the silicon substrate comprises es a photodetector.

5. The optical component of claim 1, wherein the dielectric element has a height $h_{element}$ between 1600 nm and 1900 nm and a width $d_{element}$ between 1100 nm and 1400 nm.

6. The optical component of claim 1, wherein the dielectric element has a height $h_{element}$ between 900 nm and 1300 nm and a width $d_{element}$ between 750 nm and 1050 nm.

7. The optical component of claim 1, wherein the first opening and the second opening have a width between 150 nm and 200 nm.

8. The optical component of claim 1, configured to selectively transmit incoming electromagnetic radiation with wavelength $\lambda_{inc}$, wherein a height $h_{element}$ of the dielectric element is substantially equal to $\lambda_{inc}/(n_H-n_L)$, where $n_H$ is a refractive index of the dielectric element and $n_L$ is a refractive index of an ambient medium.

9. The optical component of claim 1, configured to selectively transmit incoming electromagnetic radiation with wavelength $\lambda_{inc}$, wherein a width $d_{element}$ of the dielectric element is no less than $$\frac{2\lambda_{inc}\tan(\theta_B)}{n_H - n_L},$$

where $$\theta_B = \frac{90° - \sin^{-1}(n_L/n_H)}{2},$$

and where $n_H$ is a refractive index of the dielectric element and $n_L$ is a refractive index of an ambient medium.

10. A method comprising:
directing electromagnetic radiation on an optical component, wherein the optical component comprises:
  a substantially rectangular dielectric element having an upper surface, a lower surface, and at least one side surface, the dielectric element being arranged on a silicon substrate;
  a first electrically conductive layer disposed on the upper surface of the dielectric element, the first electrically conducting layer having a first opening of a first width configured to accept incident electromagnetic radiation; and
  a second electrically conductive layer disposed between the lower surface of the dielectric element and a top surface of the silicon substrate, the second electrically conductive layer having a second opening of a second width configured for emission of the incident electromagnetic radiation of a selected wavelength determined by the first width and by the second width into the silicon substrate,
  wherein the incident electromagnetic radiation undergoes diffraction at the at least one side surface of the dielectric element and at the first opening in the first electrically conductive layer and at the second opening in the second electrically conductive layer, such that diffracted electromagnetic radiation waves interfere constructively with spherical electromagnetic radiation waves generated at the first opening, taking into account reflections from the first electrically conductive layer, the second electrically conductive layer, and the at least one side surface of the dielectric element, thereby creating a focused optical hotspot in the silicon substrate.

11. The method of claim 10, wherein a height $h_{element}$ of the dielectric element is substantially equal to $\lambda_{inc}/(n_H - n_L)$, where $n_H$ is a refractive index of the dielectric element and $n_L$ is a refractive index of an ambient medium.

12. The method of claim 10, wherein a width $d_{element}$ of the dielectric element is no less than $$\frac{2\lambda_{inc}\tan(\theta_B)}{n_H - n_L},$$

where $$\theta_B = \frac{90° - \sin^{-1}(n_L/n_H)}{2},$$

and where $n_H$ is a refractive index of the dielectric element and $n_L$ is a refractive index of an ambient medium.

13. The method of claim 10, wherein the silicon substrate comprises a photodetector operating to detect the emission of the incident electromagnetic radiation of the selected wavelength.

14. The method of claim 10, wherein the first width and the second width are substantially the same.

* * * * *